(12) United States Patent
Yamaguchi

(10) Patent No.: US 7,001,798 B2
(45) Date of Patent: Feb. 21, 2006

(54) METHOD OF MANUFACTURING SEMICONDUCTOR DEVICE

(75) Inventor: Tadashi Yamaguchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/291,537

(22) Filed: Nov. 12, 2002

(65) Prior Publication Data

US 2003/0092253 A1    May 15, 2003

(30) Foreign Application Priority Data

Nov. 14, 2001   (JP)   .............................. 2001-349264

(51) Int. Cl.
*H01L 21/44* (2006.01)
*H01L 21/50* (2006.01)

(52) U.S. Cl. ..................... 438/114; 438/113; 438/106

(58) Field of Classification Search ................ 438/113, 438/114
See application file for complete search history.

(56) References Cited

U.S. PATENT DOCUMENTS

| | | | | |
|---|---|---|---|---|
| 6,001,671 A | * | 12/1999 | Fjelstad | 438/112 |
| 6,159,770 A | * | 12/2000 | Tetaka et al. | 438/112 |
| 6,348,726 B1 | * | 2/2002 | Bayan et al. | 257/666 |
| 6,498,392 B1 | | 12/2002 | Azuma | 257/676 |
| 6,706,547 B1 | * | 3/2004 | Sakamoto et al. | 438/33 |
| 2001/0045625 A1 | * | 11/2001 | Sakamoto et al. | 257/666 |

FOREIGN PATENT DOCUMENTS

| | | |
|---|---|---|
| JP | P11-195733 | 7/1999 |
| JP | 2000252388 A | 9/2000 |
| JP | 2000252389 A | 9/2000 |
| JP | 2000252390 A | 9/2000 |
| JP | P2000-243862 | 9/2000 |
| JP | P2001-210743 | 8/2001 |

* cited by examiner

*Primary Examiner*—Amir Zarabian
*Assistant Examiner*—Pamela E Perkins
(74) *Attorney, Agent, or Firm*—Junichi Mimura

(57) ABSTRACT

A method of manufacturing a semiconductor device includes the steps of, (1) preparing a conductive substrate having a main surface and a back surface opposite to the main surface, (2) forming at the main surface of the conductive substrate a plurality of first grooves, which are parallel to each other, and forming at the main surface of the conductive substrate a plurality of second grooves, which are parallel to each other, and which are perpendicular to the first grooves, (3) fixing a semiconductor chip to the main surface of the conductive substrate, (4) encapsulating the semiconductor chip with resin by introducing the resin onto the main surface of the conductive substrate, the resin entering into the first and the second grooves and (5) polishing the back surface of the conductive substrate until the resin formed in the first and the second grooves are exposed.

42 Claims, 23 Drawing Sheets

METHOD OF MANUFACTURING SEMICONDUCTOR DEVICE

CROSS-REFERENCE TO RELATED APPLICATION

This application claims the priority benefit of Japanese Patent Application No. 2001-349264, filed Nov. 14, 2001, the entire disclosure of which is incorporated herein by reference.

BACKGROUND OF THE INVENTION

1. Field of the Invention

The invention relates to a method of manufacturing a semiconductor device called an area-array package. The area-array package type semiconductor device, such as a BGA (Ball Grid Array) or a CSP (Chip Size Package), has external terminals each of which is disposed in a single area, and the external terminals are arranged in a grid.

2. Description of the Related Art

A semiconductor device includes a semiconductor chip encapsulated by resin. The semiconductor chip includes integrated circuits on its main surface and a plurality of terminals on its main surface connecting to the integrated circuits. One of such semiconductor devices is an area-array package type semiconductor device. The area-array package type semiconductor device also includes external terminals, each of which connects one of the terminals formed on the semiconductor chip. The external terminals are arranged in a grid.

The methods of manufacturing the area-array package type semiconductor device are introduced in Japanese laid open patent No. 2000-252389, Japanese laid open patent No. 2000-252388 and Japanese laid open patent No. 2000-252390. According to these publications, metal leaf is disposed in a mold, and then, resin material is introduced in the mold with pressure. Since the mold has concavity or convexity arranged in a grid on its surface, the metal leaf is transformed along the concavity or convexity by using pressure applied to the resin material when the resin material is introduced in the mold. The terminals formed on the semiconductor chip is connected to the metal leaf formed on the concavity or convexity by bonding wires. After the resin material is solidified, the semiconductor device is detached from the mold. Since the metal leaf is fixed to the solidified resin, the metal leaf is exposed at the bottom of the semiconductor device. The exposed metal leaf is divided into a plurality of the separated area in a grid by high pressure jet water or laser beam. Each separated area formed of the metal leaf becomes an external terminal base, and an external terminal such as solder ball is formed on each external terminal base.

However, according to the method described above, since the metal leaf exposed from the bottom of the resin material is divided, the resin may also be damaged by the overcutting. This may cause the semiconductor chip or the bonding wires connected the semiconductor chip to be damaged.

SUMMARY OF THE INVENTION

An objective of the invention is to resolve the above-described problem and to provide a method of forming a semiconductor device.

The objective is achieved by a method of manufacturing a semiconductor device, including the steps of, (1) preparing a conductive substrate having a main surface and a back surface opposite to the main surface, (2) forming at the main surface of the conductive substrate a plurality of first grooves, which are parallel to each other, and forming at the main surface of the conductive substrate a plurality of second grooves, which are parallel to each other, and which are perpendicular to the first grooves, (3) fixing a semiconductor chip to the main surface of the conductive substrate, (4) encapsulating the semiconductor chip with resin by introducing the resin onto the main surface of the conductive substrate, the resin entering into the first and the second grooves and (5) polishing the back surface of the conductive substrate until the resin formed in the first and the second grooves are exposed.

BRIEF DESCRIPTION OF THE DRAWINGS

The invention will be more particularly described with reference to the accompanying drawings, in which.

DETAILED DESCRIPTION OF THE PREFERRED EMBODIMENTS

In the first through ninth embodiments, the same reference numbers designate the same or similar components.

First Embodiment

Figure 1A:
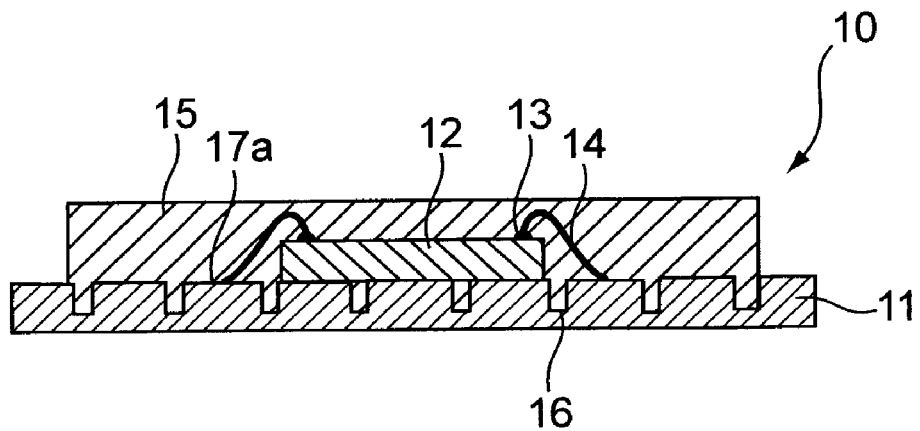
FIGS. 1A through 1C are sectional views showing successive stages in the manufacturing an area-array package type semiconductor device, according to a first embodiment of the invention.
Figure 1B:
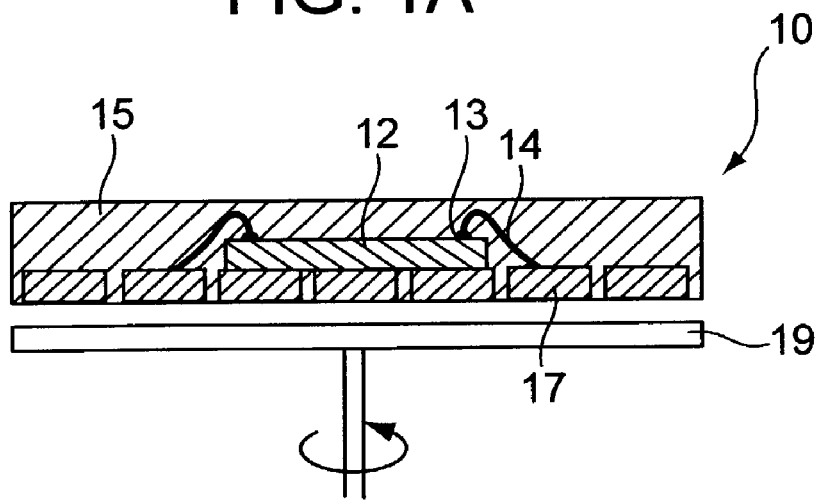
Figure 1C:
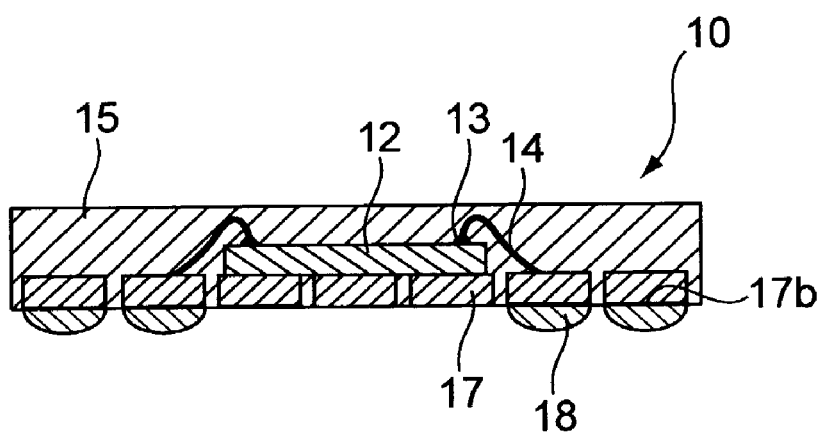

FIGS. 1A through 1C shows successive stages in the manufacturing an area-array package type semiconductor device 10. Referring to FIG. 1A, the semiconductor device 10 includes a semiconductor chip 12 having terminals 13, a conductive substrate 11, and bonding wires 14 connecting one of the terminals 13 formed on the semiconductor chip 12 to the conductive substrate 11. The conductive substrate 11 is formed of metal alloy in which copper is a main element or of 42 metal alloy formed of iron and nickel, and has a 300 μm thickness. The semiconductor chip is fixed on a main surface of the conductive substrate 11 by an insulating tape, and is encapsulated with resin 15 by a well-known transfer molding method. The semiconductors chip 12 includes integrated circuits, and its terminals 13 act as I/O terminal.

Figure 2:
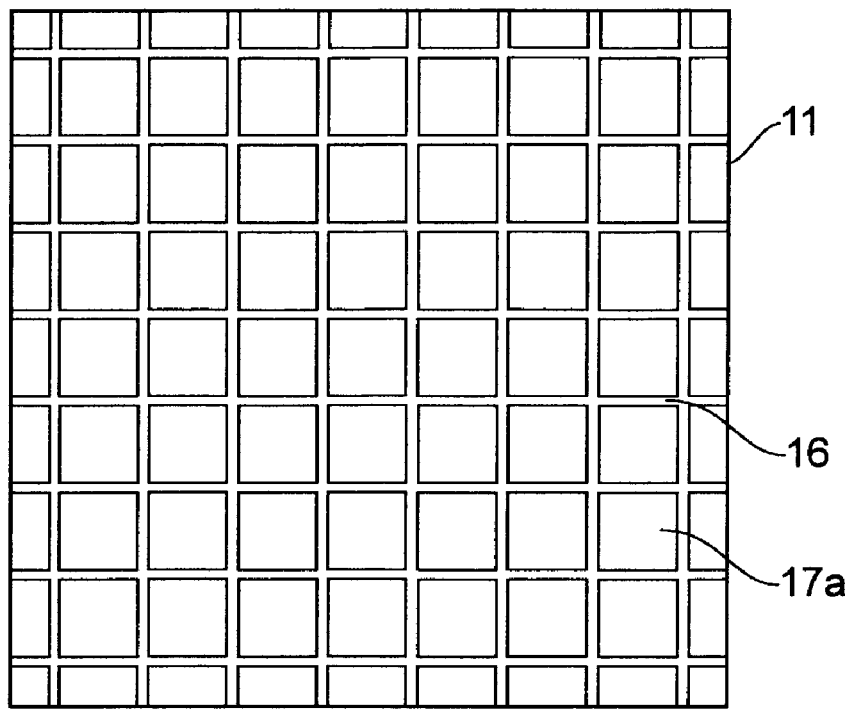
FIG. 2 is a top plane view of a conductive substrate used in FIGS. 1A–1C.

As shown in FIG. 2, the conductive substrate 11 has grid grooves 16 at its main surface. The grid grooves 16 are formed by whittling the main surface of the conductive substrate 11 by using a saw cutter. Thus, areas 17a are defined on the main surface of the conductive substrate 11 by the grid grooves 16. The grid grooves 16 consist of first grooves disposed in parallel and second grooves disposed in parallel and perpendicular to the first grooves.

It is preferable that the depths of the grid grooves 16 be uniform, and be deeper than a half of the thickness of the conductive substrata 11. According to the first embodiment, the depth of each grid groove 16 is 200 μm approximately. The grid grooves 16 may be formed by an etching method.

Figure 3:
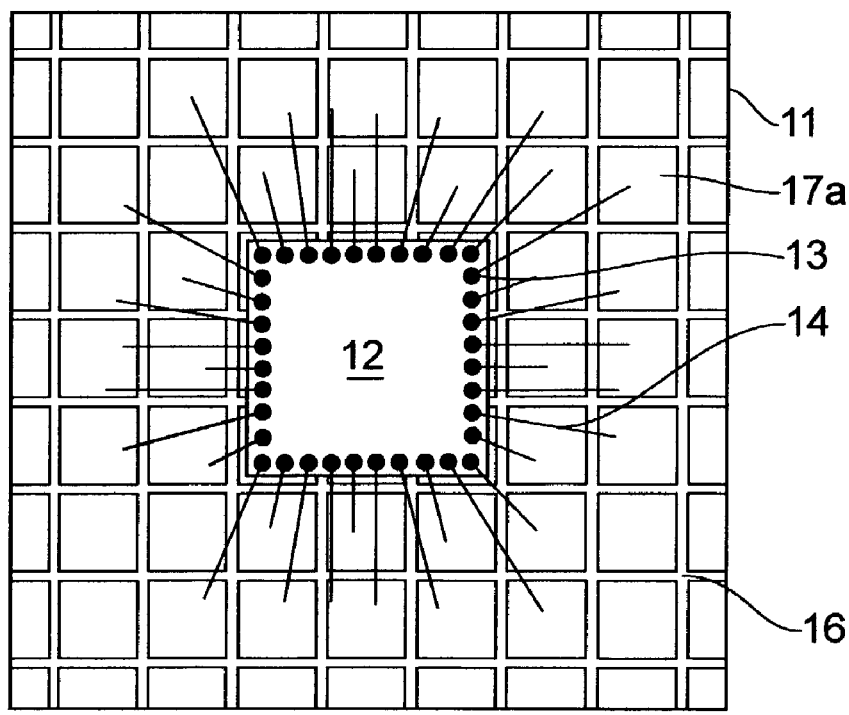
FIG. 3 is a top plane view showing a relationship among the conductive substrate used in FIGS. 1A–1C, a semiconductor chip formed on the conductive substrate and the bonding wires connecting the semiconductor chip to the conductive substrate.

As shown in FIG. 3, the semiconductor chip 12 is disposed in a center of the areas 17a. Each area 17a, which is arranged on the periphery of the semiconductor chip 12, is connected to one of the terminals 13 of the semiconductor chip 12 by bonding wire 14.

As shown FIG. 1A, since the semiconductor chip 12 is formed on the main surface of the conductive substrate 11 on which the grid grooves are formed, the resin 15 enters into the grid grooves 16. Referring to FIG. 1B, after the semiconductor chip 12 and the bonding wires 14 are encapsulated on the conductive substrate 11 by the resin 15, a back surface of the conductive substrate 11, which is opposite to the main surface, is polished mechanically by using a polisher 19 or chemically until the resin 15 formed in the grid grooves 16 is exposed. Meanwhile, when the resin 15 is solidified, the resin 15 is once heated. Thus, an oxide layer is formed on the back surface of the conductive substrate 11 unexpectedly. However, during the polishing step, the oxide layer is removed.

In the polishing step, the conductive substrate 11 is polished for 100 μm. According to the polishing step, the areas 17a, each of which is encompassed by the resin 15, are electrically separated to each other, and each of them becomes an external terminal base 17.

As described above, the polishing activity is halted when it is confirmed the resin 15 formed on the grid grooves 16 is exposed. Thus, the distance between the polished surface and the resin 15 formed on the main surface of the conductive substrate 11 is 200 μm. This 200 μm thickness acts as a process margin. Thus, if the conductive substrate 11 is over-polished by accident, it is possible to avoid reaching the polisher 19 to the resin 15 formed on the main surface of the conductive substrate 11 because of this big process margin. Accordingly, the semiconductor chip 12 and the bonding wires 14, which are covered by the resin 15, are not damaged by an accidental over-polishing.

It is possible to form the external terminal bases 17 by cutting the back surface of the conductive substrate 11 with a saw cutter, instead of the polisher 19. However, it is not easy to cut the conductive substrate 11 along the grid grooves 16 accurately. If a location of the saw cutter is tilted from the grid grooves 16, the semiconductor chip 12 and the bonding wires 14 may be damaged. On the other hand, by using the polisher 19, the conductive substrate 11 is cut back evenly. Thus, it is preferable to use the polisher 19 in order to form the external terminal bases 17.

Figure 4:
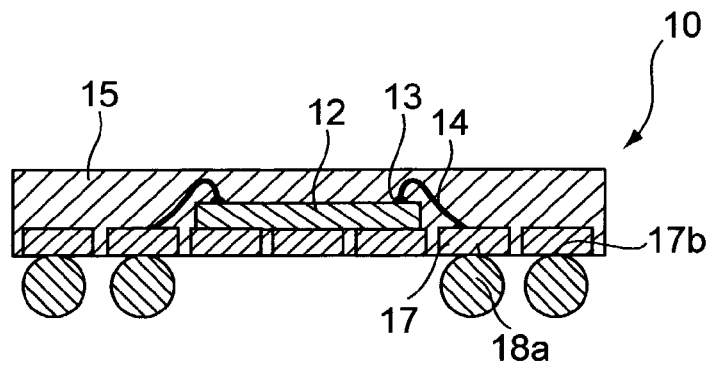
FIG. 4 is a sectional view of an alternative area-array package type semiconductor device in which ball-shaped external terminals are formed instead of coupling layers used in FIG. 1C.

Referring to FIG. 1C, after the external terminal bases 17 are formed, a coupling layer 18 made of solder paste is formed on a polished surface 17b of each external terminal base 17 by the well-known solder screen printing method. This coupling layer 18 acts as an external terminal. If necessary, the coupling layer 18 as a dummy layer may be formed on the external terminal base 17, which is not connected to the semiconductor chip 12. Further, as shown in FIG. 4, solder ball 18a may be formed by using flux instead of the coupling layers 18.

According to the first embodiment, since the semiconductor chip 12 is disposed on the conductive substrate 11 having the grid grooves 16 on its main surface, and then, the conductive substrate 16 is polished until the resin 15 formed in the grid grooves 11 is exposed, it is possible to divide the conductive substrate 11 into the external terminal bases 17, which are arranged in a grid, and are electrically separated to each other without making any damages to the semiconductor chip 12 and the bonding wires 14 because the polisher 19 has never reached to the resin 15 formed on the conductive substrate 11.

Further, since the oxide layer formed on the back surface of the conductive substrate 11 is polished out at the same time that the conductive substrate 11 is polished, it is possible to form the coupling layer 18 on the external terminal base 17 without considering an additional process for removing the oxide layer.

Second Embodiment

Figure 5A:
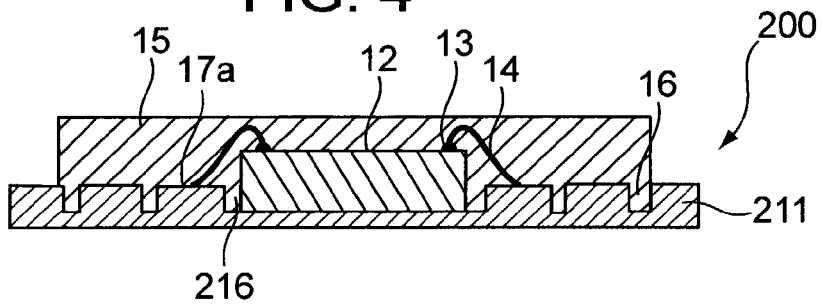
FIGS. 5A through 5C are sectional views showing successive stages in the manufacturing an area-array package type semiconductor device, according to a second embodiment of the invention.
Figure 5B:
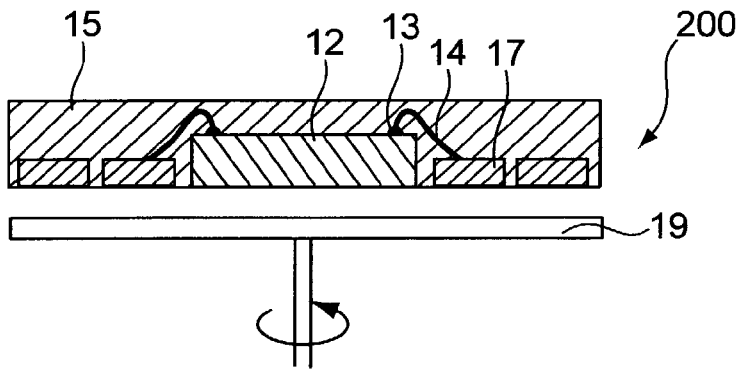
Figure 5C:
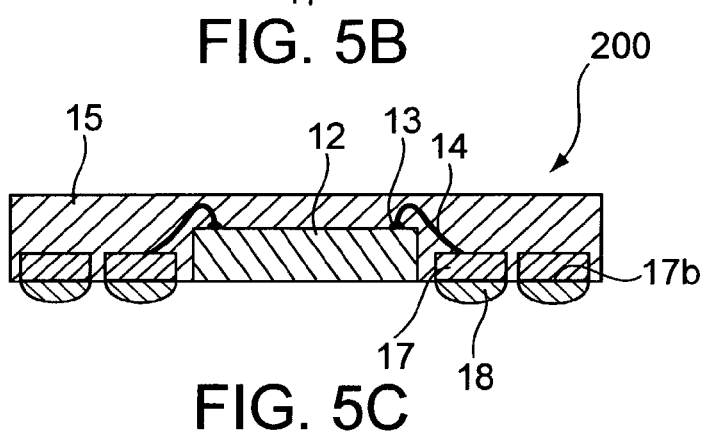

FIGS. 5A through 5C shows successive stages in the manufacturing an area-array package type semiconductor device 200. Referring to FIG. 5A, the semiconductor device 200 includes a semiconductor chip 12 having terminals 13, a conductive substrate 211, and bonding wires 14 connecting one of the terminals 13 formed on the semiconductor chip 12 to the conductive substrate 211. The conductive substrate 211 is formed of metal alloy in which copper is a main element or of 42 metal alloy formed of iron and nickel, and has a 300 $\mu$m thickness. The semiconductor chip 12 is fixed on a main surface of the conductive substrate 211 by an insulating tape, and is encapsulated with resin 15 by a well-known transfer molding method. The semiconductors chip 12 includes integrated circuits, and its terminals 13 act as I/O terminal.

Figure 6:
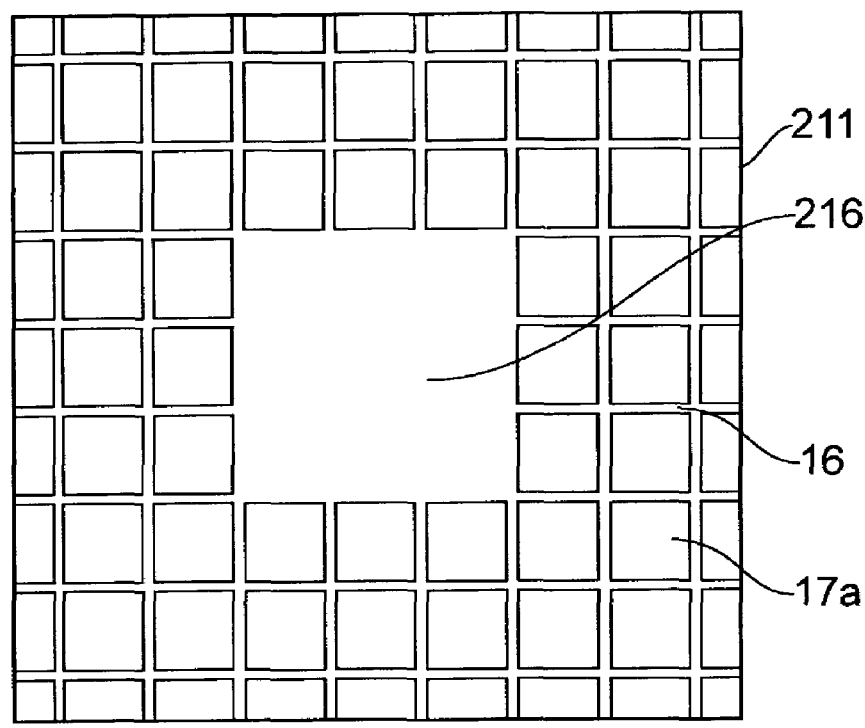
FIG. 6 is a top plane view of a conductive substrate used in FIGS. 5A–5C.

As shown in FIG. 6, the conductive substrate 211 has grid grooves 16 at its main surface and a cavity 216. The grid grooves 16 are formed by the same method as described in the first embodiment. Thus, areas 17a are defined on the main surface of the conductive substrate 11 by the grid grooves 16. The grid grooves 16 consist of first grooves disposed in parallel and second grooves disposed in parallel, and perpendicular to the first grooves. Further, the cavity 216 is formed on the same surface as the grid grooves are formed. The cavity 216 is arranged at the center of the conductive substrate 211. The cavity 216 is formed by the well-known etching method, and its depth is almost the same as those of the grid grooves 16. The size of the cavity 216 is larger enough than that of the semiconductor chip 12. Since the grid grooves 16 may be formed by the etching method as described in the first embodiment, the cavity 216 and the grid grooves 16 can be formed simultaneously when the grid grooves 16 is formed by the etching method.

It is preferable that the depths of the grid grooves 16 be uniform, and be deeper than a half of the thickness of the conductive substrata 11. According to the second embodiment, the depths of the grid grooves 16 and the cavity 216 are 200 $\mu$m approximately.

Figure 7:
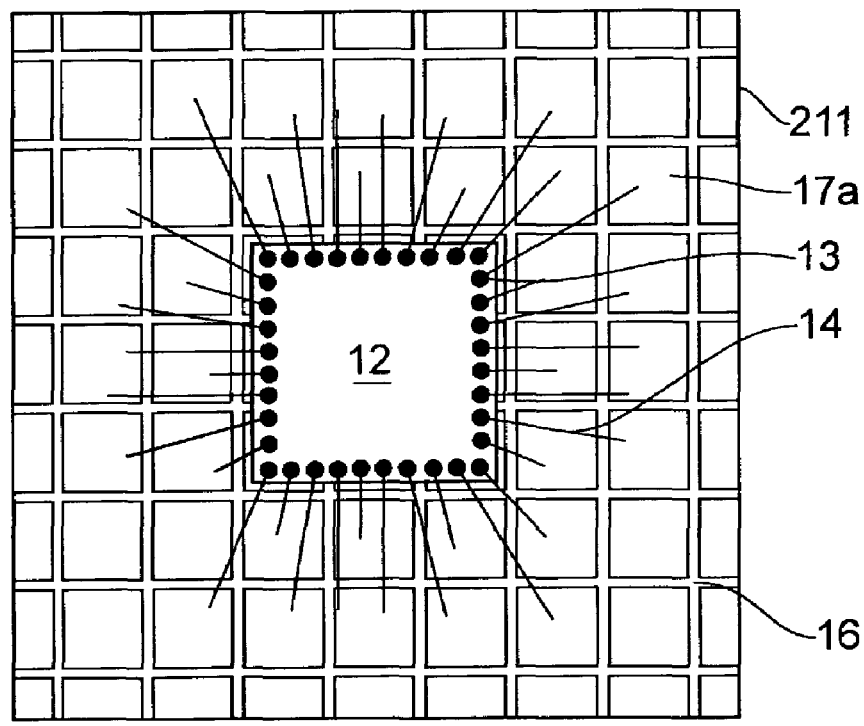
FIG. 7 is a top plane view showing a relationship among the conductive substrate used in FIGS. 5A–5C, a semiconductor chip formed on the conductive substrate and the bonding wires connecting the semiconductor chip to the conductive substrate.

Then, as shown in FIG. 7, the semiconductor chip 12 is fixed in the cavity 216 and each terminal 13 is connected to one of the areas 17a defined by the grid grooves 16.

As shown in FIG. 5A, the semiconductor chip 12 is disposed in the cavity 216, and fixed to the conductive substrate 211 by the insulating tape. Each area 17a, which is arranged on the periphery of the semiconductor chip 12, is connected to one of the terminals 13 of the semiconductor chip 12 by a bonding wire 14.

As further shown FIG. 5A, since the semiconductor chip 12 is formed on the main surface of the conductive substrate 211 on which the grid grooves 16 are formed, the resin 15 enters into the grid grooves 16. Further, since the size of the cavity 216 is larger enough than that of the semiconductor chip 12, the resin 15 also enters in a room formed between the cavity 216 and the semiconductor chip 12. Referring to FIG. 5B, after the semiconductor chip 12 and the bonding wires 14 are encapsulated on the conductive substrate 211 by the resin 15, a back surface of the conductive substrate 211, which is opposite to the main surface, is polished mechanically by using a polisher 19 or chemically until the resin 15 formed in the grid grooves 16 is exposed. Since the depth of the grid groove 16 and the depth of the cavity 216 are the same, the back surface of the semiconductor chip 12 is also exposed when the resin 15 in the grid grooves 16 is exposed. Meanwhile, when the resin 15 is solidified, the resin 15 is once heated. Thus, an oxide layer is formed on the back surface of the conductive substrate 211 unexpectedly. However, during the polishing step, the oxide layer is removed.

In the polishing step, the conductive substrate 211 is polished for 100 $\mu$m. According to the polishing step, the areas 17a are electrically separated to each other, and each of them becomes an external terminal base 17.

As well as the first embodiment, the polishing activity is halted when it is confirmed that the resin 15 formed on the grid grooves 16 is exposed. Thus, the distance between the polished surface and the resin 15 formed on the main surface of the conductive substrate 211 is 200 $\mu$m. This 200 $\mu$m thickness acts as a process margin. Thus, if the conductive substrate 211 is over-polished by accident, it is possible to avoid reaching the polisher 19 to the resin 15 formed on the main surface of the conductive substrate 211 because of this big process margin. Accordingly, the main surface of the semiconductor chip 12 and the bonding wires 14, which are covered by the resin 15, are not damaged by an accidental over polishing.

Figure 8:
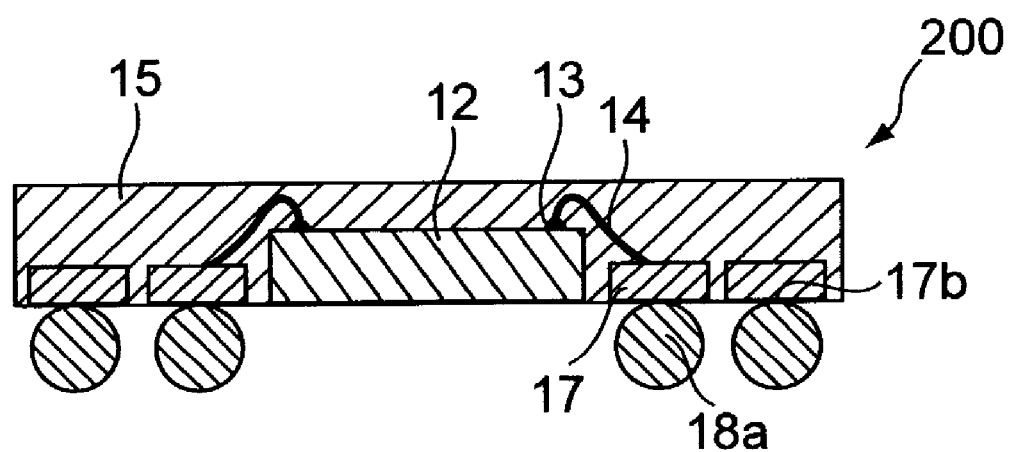
FIG. 8 is a sectional view of an alternative area-array package type semiconductor device in which ball-shaped external terminals are formed instead of coupling layers used in FIG. 5C.

Referring to FIG. 5C, after the external terminal bases 17 are formed, a coupling layer 18 made of solder paste is formed on a polished surface 17b of each external terminal base 17 by the well-known solder screen printing method. This coupling layer 18 acts as an external terminal. Further, as shown in FIG. 8, solder balls 18a may be formed instead of the coupling layers 18 by using flux.

In the second embodiment described above, the depth of the grid grooves 16 and the depth of the cavity 216 are almost the same. However, the depth of the grid grooves 16 may be deeper than that of the cavity 216. In this case, the resin 15 formed in the grid grooves 16 is exposed first, and then, the bottom of the semiconductor chip 12 is exposed by the successive polishing activity. The polishing activity is halted when it is confirmed that the bottom of the semiconductor chip 12 is exposed. In this alternative embodiment, since the grid grooves 16 are formed deeper than the cavity 216, each external terminal base 17a can be electrically separated certainly when the bottom of the semiconductor chip 12 is exposed.

According to the second embodiment, in addition to the benefit of the first embodiment, since the bottom of the semiconductor chip 12 is exposed, it is possible to leak heat emerged in the semiconductor chip 16 to an atmosphere directly.

Third Embodiment

Figure 9:
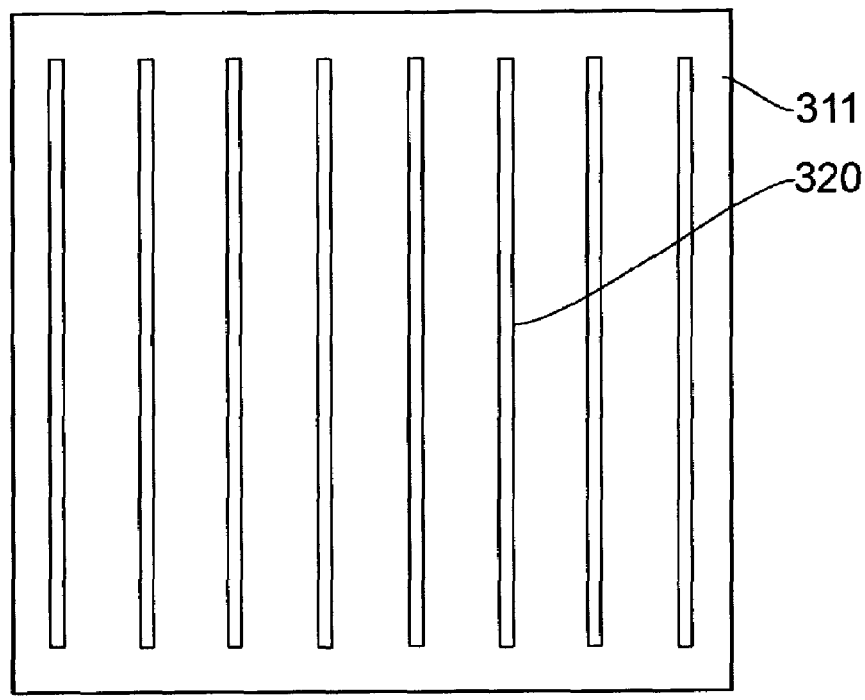
FIG. 9 is a top plane view of a conductive substrate used in a third embodiment of the invention.

Referring to FIG. 9, a conductive substrate 311 having a plurality of slits 320 on its main surface is prepared. The conductive substrate 311 having a thickness of 100 μm is made of the same material as used in the conductive substrate 11 or 211 of the first or the second embodiment. Each slit 320 is arranged in parallel to each other, and each slit 320 elongates in the same direction along one side of the conductive substrate 311. Each slit 320 like an elongating opening penetrates the conductive substrate 311 from its main surface where a semiconductor chip 12 is disposed, to its back surface opposite to the main surface. The distance between the adjacent slits 320 is almost the same. The slits 320 are formed by the well-known cutting operation using a saw cutter, by a punching press operation or by an etching operation. Every edge of slits 320 is formed in the right angle to the main surface of the conductive substrate 311.

Figure 10:
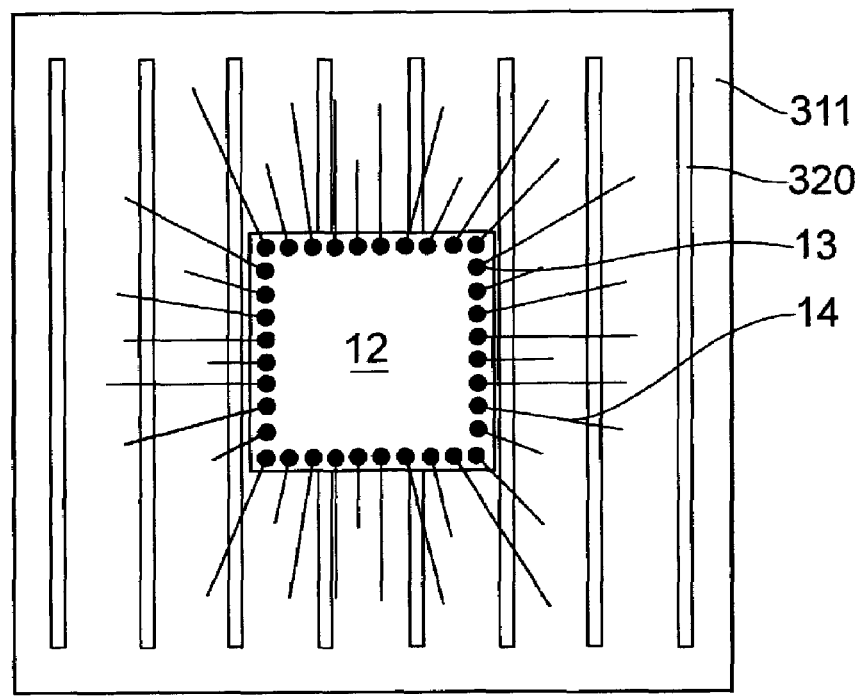
FIG. 10 is a top plane view showing a relationship among the conductive substrate shown in FIG. 9, a semiconductor chip formed on the conductive substrate and the bonding wires connecting the semiconductor chip to the conductive substrate.

Referring to FIG. 10, the semiconductor chip 12 having terminal 13 is disposed in the center of the conductive substrate 311, and is fixed on the main surface of the conductive substrate 311 by the insulating tape. Each terminal 13 formed on the semiconductor chip 12 is connected to the conductive substrate 311 at the predetermined location by a bonding wire 14.

Figure 11:
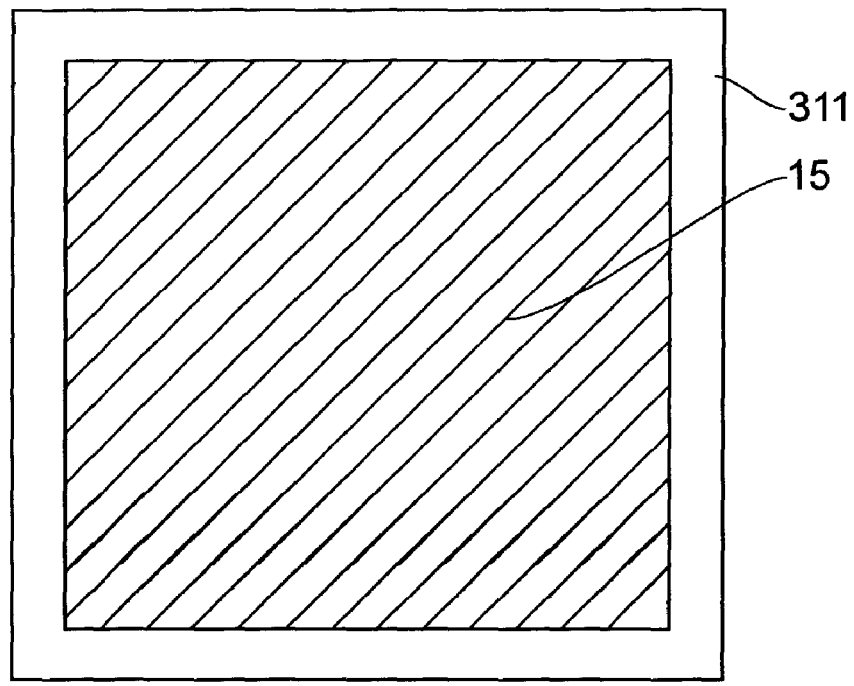
FIG. 11 is a top plane view showing the conductive substrate after the semiconductor chip is encapsulated.

As shown in FIG. 11, the semiconductor chip 12 and the bonding wires 14 are encapsulated on the conductive substrate 311 by resin 15. Simultaneously, the resin 15 enters into the slits 320.

Figure 12:
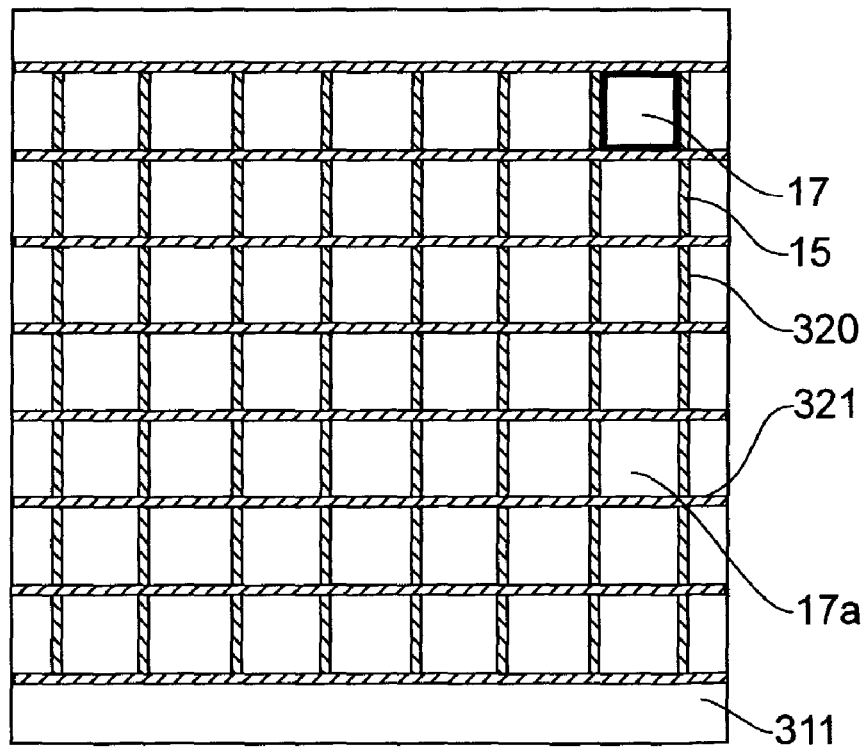
FIG. 12 is a bottom plane view showing the conductive substrate of FIG. 11 after the dividing grooves are formed.

Referring to FIG. 12, after the semiconductor chip 12 and the bonding wires 14 are encapsulated by the resin 15, the resin 15 formed in the slits 320 is exposed from the back surface of the conductive substrate 311. A plurality of dividing groove 321, which extend perpendicular to the slits 320, are, then, formed at the back surface of conductive substrate 311 by a cutting operation using a saw cutter. Each dividing groove 321 is formed in parallel to each other. The dividing grooves 321 reach the resin 15 formed on the main surface of the conductive substrate 311. In other words, the cutting operation to form the dividing grooves 321 is halted when the saw cutter reaches the resin 15, which is formed on the main surface of the conductive substrate 311.

After the cutting operation is completed, the conductive substrate 311 are divided into areas 17a, which are electrically separated to each other by the dividing groove 321 and the resin 15 formed in the slits 320, and each of areas 17a becomes an external terminal base 17. Then, the semiconductor device 300 is completed.

Figure 13:
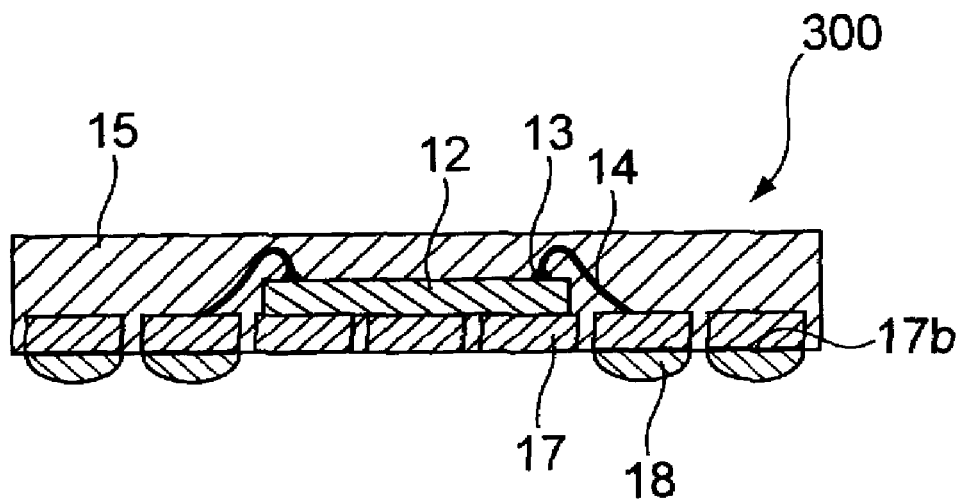
FIG. 13 is a sectional view showing an area-array package type semiconductor device of the third embodiment.

Referring to FIG. 13, after the external terminal bases 17 are formed, a coupling layers 18 made of solder paste is formed on a back surface 17b of each external terminal base 17 by the well-known solder screen printing method. This coupling layer 18 acts as an external terminal.

According to the third embodiment, since the slits 320 are formed in the conductive substrate 311 prior to the step of encapsulating the semiconductor chip 12 with the resin 15, it is not necessary to cut conductive substrate 311 in grid after the semiconductor chip 12 is encapsulated by the resin 15. In other words, according to the third embodiment, after the semiconductor chip 12 is encapsulated by the resin 15, the conductive substrate 311 is cut in a single direction perpendicular to the slits 320 in order to form the external terminal bases 17.

Figure 14:
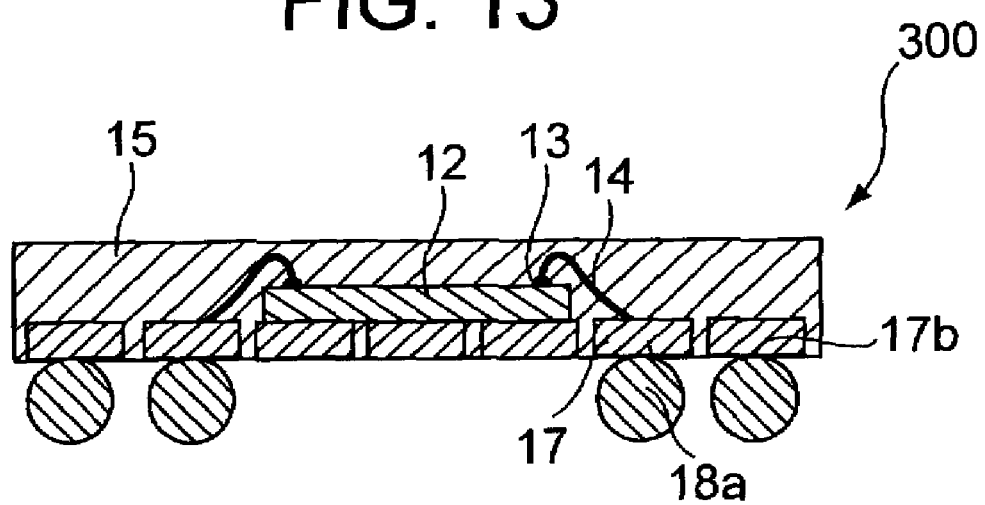
FIG. 14 is a sectional view showing an alternative area-array package type semiconductor device of the third embodiment.

The dividing groove 321 may be formed by an etching method, or another mechanical method like a drilling method, which is described later. Further, as shown in FIG. 14, solder balls 18a may be formed by using flux instead of the coupling layers 18.

According to the third embodiment, as described above, after the semiconductor chip 12 is fixed on the conductive substrate 311 having slits 320, and then, is encapsulated by the resin 15, the conductive substrate 311 is cut at its back surface in a single direction perpendicular to the slits 320 in order to form the external terminal bases 17. Thus, comparing the conventional art described above that the consecutive substrate is cut in grid (namely the cut in the horizontal and vertical directions) after the semiconductor chip and the bonding wires are sealed by resin, it is possible to reduce the possibility of the damage that the semiconductor chip 12 and the bonding wires 14 receive because the cutting operation is performed in the single direction after the semiconductor device 300 is sealed by the resin 15.

Fourth Embodiment

The deference between the third embodiment and this fourth embodiment is a step of manufacturing a conductive substrate 411. Thus, the other processes in order to form the semiconductor device 400 are the same as or similar to those described in the third embodiment.

Figure 15A:
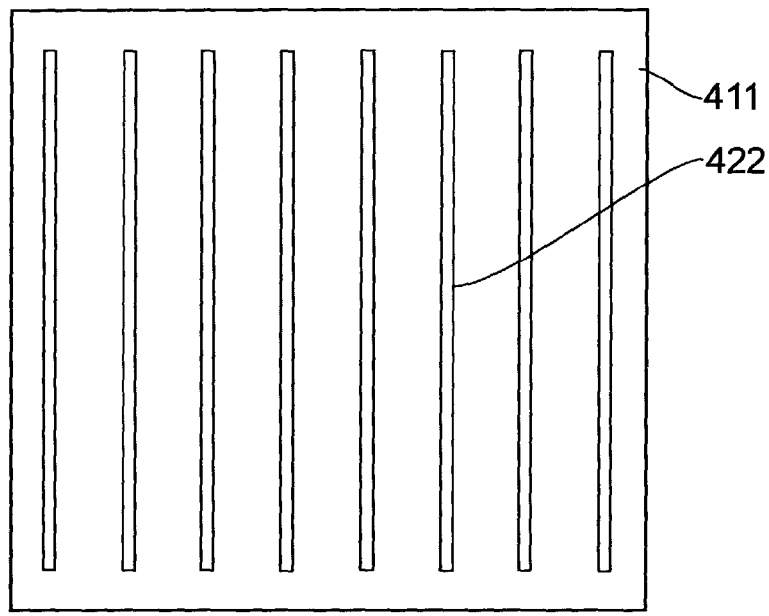
FIG. 15A is a top plane view of a conductive substrate used in a fourth embodiment of the invention.

Referring to the FIG. 15A, a conductive substrate 411 having a plurality of slits 422 is prepared. The conductive substrate 411 having a thickness of 100 μm is made of the same material as these used in the embodiments described above. Each slit 422 is arranged in parallel to each other, and each slit 422 elongates in the same direction along one side of the conductive substrate 411. Each slit 422 like an elongating opening penetrates the conductive substrate 411 from its main surface where a semiconductor chip 12 is disposed, to its back surface opposite to the main surface. The distance between the adjacent slits 422 is almost the same.

Figure 16:
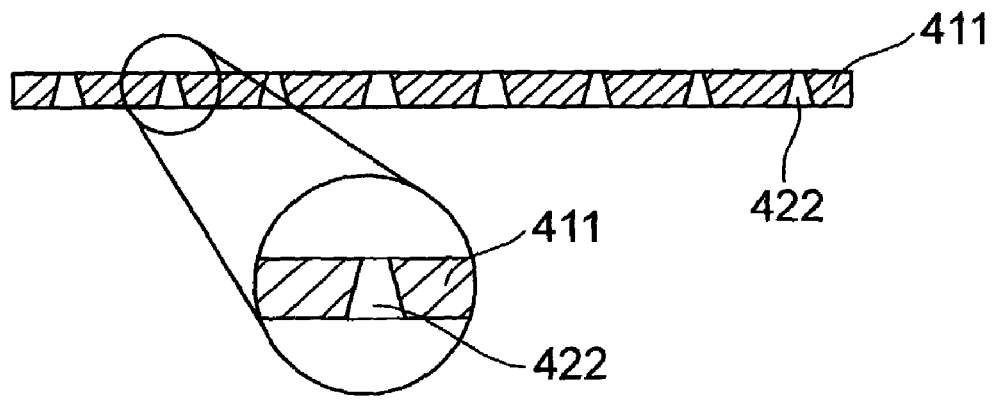
FIG. 16 is a sectional view of the conductive substrate of FIG. 15A.

As shown in FIG. 16, the shape of the slit 422 differs from that of the slits 320 of the third embodiment. The slit 422 of the fourth embodiment has a relatively small opening at the main surface of the conductive substrate 411 and a relatively large opening at the back surface of the conductive substrate 411. In other words, the slit 422 extends from the main surface toward the back surface with getting wider gradually. Thus, the slits 422 are formed by an etching operation or by a cutting operation using a blade, which is suitable for the above described slit's shape.

As well as FIG. 10 of the third embodiment, the semiconductor chip 12 having terminal 13 is disposed in the center of the conductive substrate 411, and is fixed on the main surface of the conductive substrate 411 by the insulating tape. Each terminal 13 formed on the semiconductor chip 12 is connected to the conductive substrate 411 at the predetermined location by a bonding wire 14.

As well as FIG. 11 of the third embodiment, the semiconductor chip 12 and the bonding wires 14 are encapsulated on the conductive substrate 411 by resin 15. Simultaneously, the resin 15 enters into the slits 422.

Figure 15B:
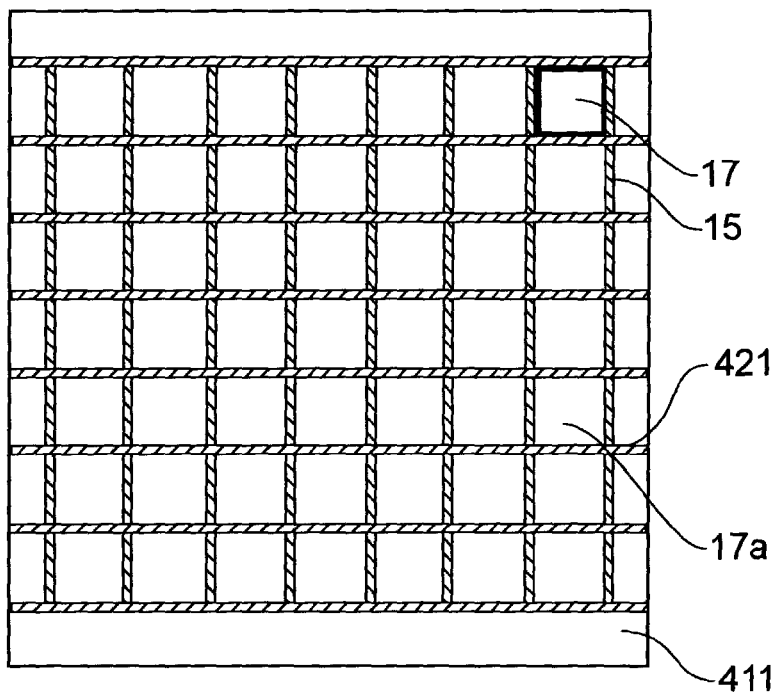
FIG. 15B is a bottom plane view showing the conductive substrate of FIG. 15A after the dividing grooves are formed.

Referring to FIG. 15B, after the semiconductor chip 12 and the bonding wires 14 are encapsulated by the resin 15, the resin 15 formed in the slits 422 is exposed from the back surface of the conductive substrate 411. A plurality of dividing groove 421, which extend perpendicular to the slits 422, are, then, formed at the back surface of conductive substrate 411 by a cutting operation using a saw cutter. Each dividing groove 421 is formed in parallel to each other. The dividing grooves 421 reach the resin 15 formed on the main surface of the conductive substrate 411. In other words, the cutting operation to form the dividing grooves 421 is halted when the saw cutter reaches the resin 15, which is formed on the main surface of the conductive substrate 411.

After the cutting operation is completed, the conductive substrate 411 are divided into the areas 17a, which are electrically separated to each other by the dividing groove 421 and the resin 15 formed in the slits 422, and each of areas 17a becomes an external terminal base 17.

Figure 17:
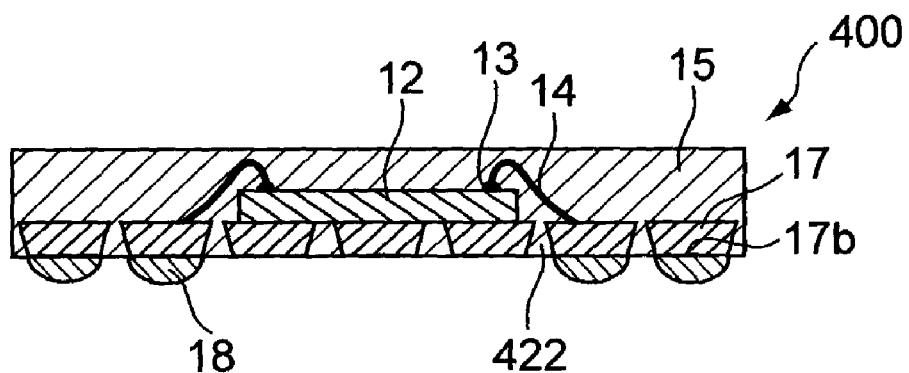
FIG. 17 is a sectional view showing an area-array package type semiconductor device of the fourth embodiment.

Then, referring to FIG. 17, after the external terminal bases 17 are formed, a coupling layer 18 made of solder paste is formed on a back surface 17b of each external terminal base 17 by the well-known solder screen printing method. This coupling layer 18 acts as an external terminal. Then, the semiconductor device 400 is completed.

According to the fourth embodiment, as shown in FIG. 17, since each slit 422 extends from the main surface of the conductive substrate 411 toward the back surface with getting wider gradually, the resin 15 formed in each slit 422 is formed in the same shape as that of each slit 422. Namely, the cross-sectional surface of the resin 15 formed in the slit 422 is trapezoid. Therefore, in addition to the benefits of the third embodiment, according to the fourth embodiment, since the resin 15 formed in the slit 422 is trapezoid, the area of the external terminal base 17 at its main surface is larger than that of the external terminal base 17 at its back surface 17b. Further, comparing to the third embodiment, a contacting area between the resin 15 and the external terminal base 17 in the slits 422 is larger in the fourth embodiment. As the result, it is possible to avoid removing the external terminal bases 17 from the resin 15.

Figure 18:
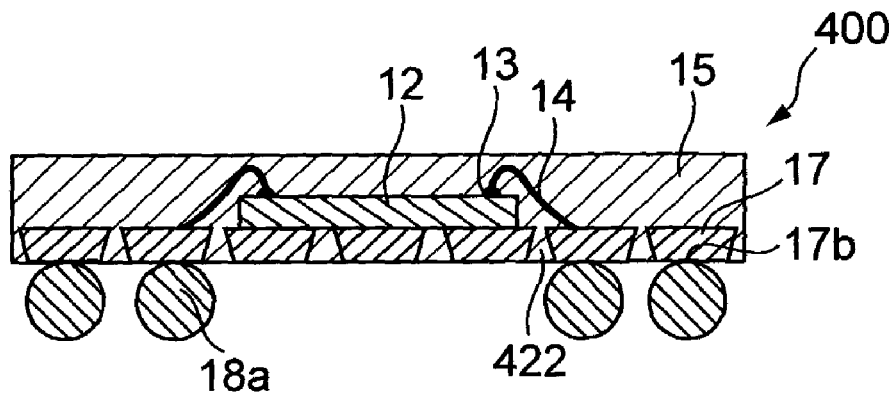
FIG. 18 is a sectional view showing an alternative area-array package type semiconductor device of the fourth embodiment.

As well as the third embodiment, as shown in FIG. 18, solder balls 18a may be formed by using flux instead of the coupling layers 18.

Fifth Embodiment

The deference between the third embodiment and this fifth embodiment is a step of manufacturing a conductive substrate 511. Thus, the other processes in order to form the semiconductor device are the same as or similar to those described in the third embodiment.

Figure 19:
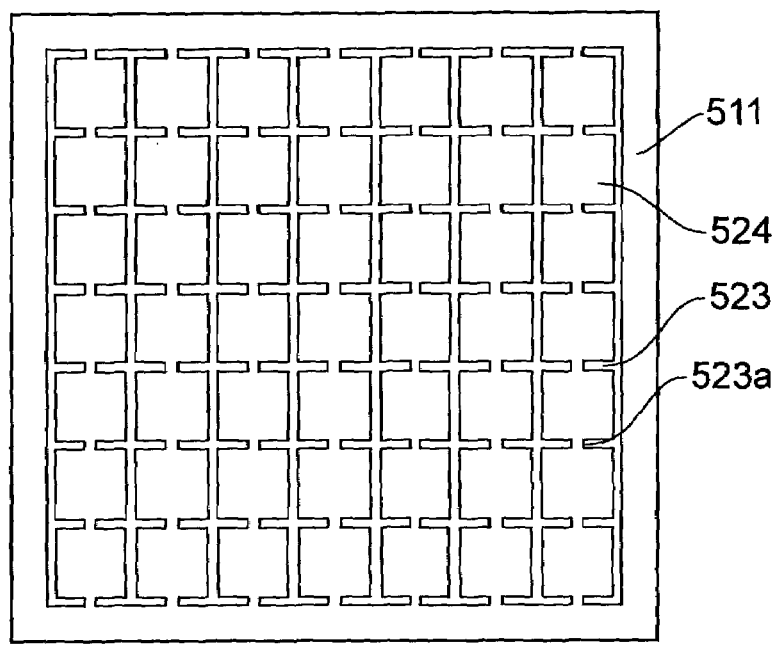
FIG. 19 is a top plane view of a conductive substrate used in a fifth embodiment of the invention.

Referring to the FIG. 19, a conductive substrate 511 having a plurality of slits 523 is prepared. The conductive substrate 511 having a thickness of 100 μm is made of the same material as used in the embodiments described above. Each slit 523 is arranged in parallel to each other, and each slit 523 elongates in the same direction along one side of the conductive substrate 511. Each slit 523 like an elongating opening penetrates the conductive substrate 511 from its main surface where a semiconductor chip 12 is disposed, to its back surface opposite to the main surface. The distance between the adjacent slits 523 is almost the same. Each slit 523 has extending parts 523a. The extending parts 523a are formed at specified intervals, and are extended perpendicular to the slit 523. The extended parts 523a extended from the adjacent slits 523 face to each other, but not connected.

That is, the tips of the extended parts 523a are arranged at specified distance. Under this state, areas 524, which are substantially encompassed by the slits 523 and the extending parts 523a, are defined.

The slits 523 and the extending parts 523a are formed by an etching operation or a photolithography. The slits 523 and the extending parts 523a may be formed by a punching press operation, which is suitable for high accurate process.

Figure 20:
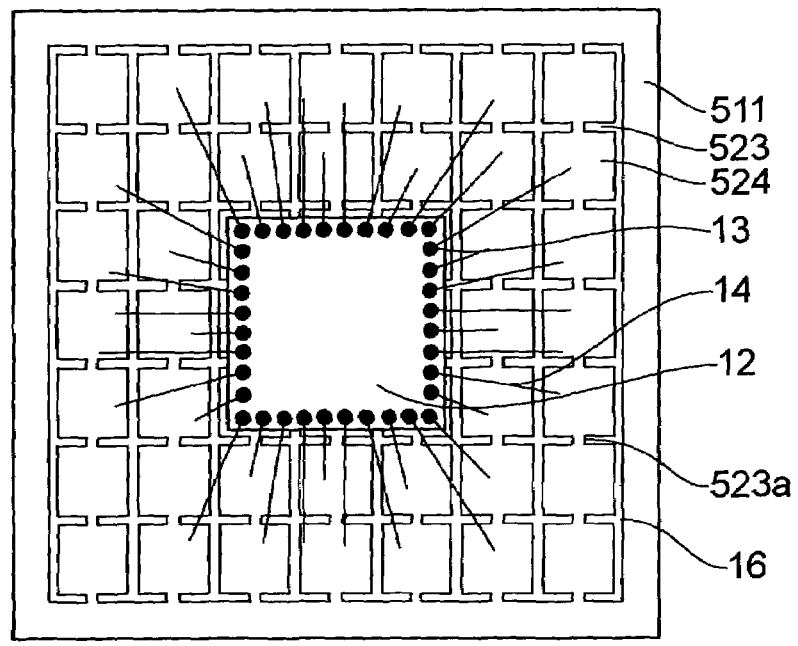
FIG. 20 is a top plane view showing a relationship among the conductive substrate shown in FIG. 19, a semiconductor chip formed on the conductive substrate and the bonding wires connecting the semiconductor chip to the conductive substrate.

Referring to FIG. 20, the semiconductor chip 12 having terminal 13 is disposed in the center of the conductive substrate 511, and is fixed on the main surface of the conductive substrate 511 by the insulating tape. Each terminal 13 formed on the semiconductor chip 12 is connected to one of the areas 524 of the conductive substrate 511 by a bonding wire 14. Then, as well as FIG. 11 of the third embodiment, the semiconductor chip 12 and the bonding wires 14 are encapsulated on the conductive substrate 511 by resin 15. Simultaneously, the resin 15 enters into the slits 523 and the extending parts 523a.

Figure 21:
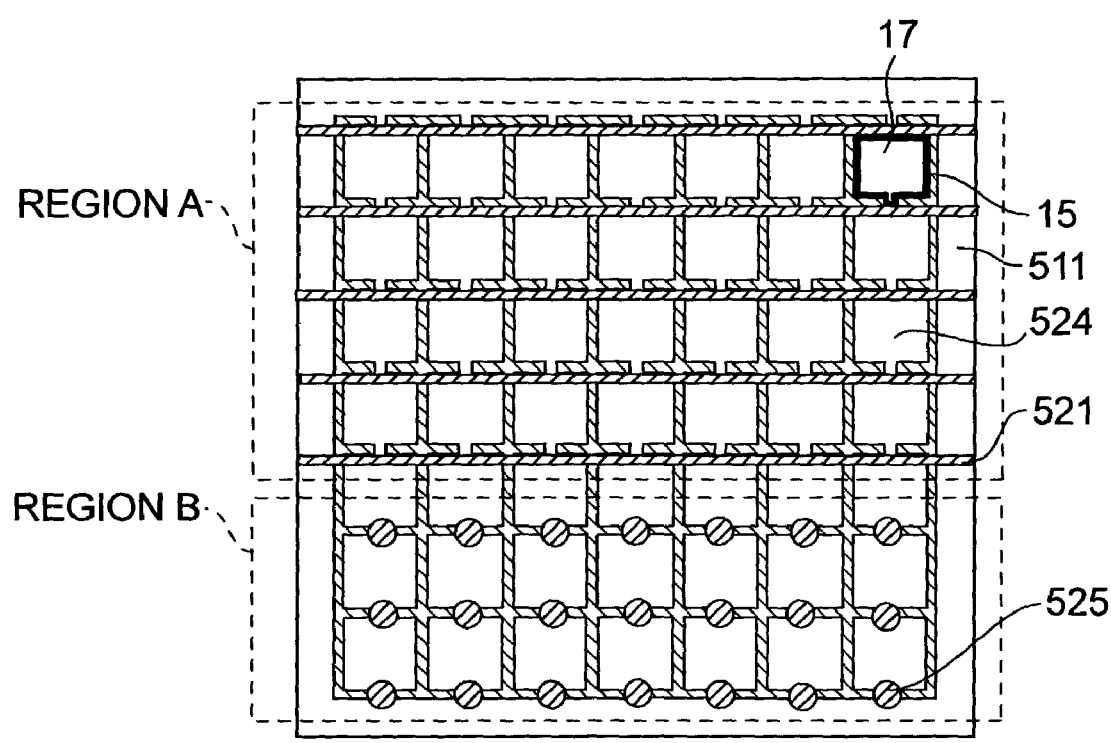
FIG. 21 is a bottom plane view showing the conductive substrate of FIG. 20 after the dividing grooves and dividing holes are formed.

Referring to FIG. 21, after the semiconductor chip 12 and the bonding wires 14 are encapsulated by the resin 15, the resin 15 formed in the slits 523 and the extending parts 523a is exposed from the back surface of the conductive substrate 511. Then, referring a region A of FIG. 21, a plurality of dividing grooves 521, which extend perpendicular to the slits 523 and along the extending parts 523a, are formed by a cutting operation using a saw cutter. Each dividing groove 521 is formed at the back surface of conductive substrate 511, and is in parallel to each other. The dividing grooves 521 reach the resin 15 formed on the main surface of the conductive substrate 511. In other words, the cutting operation to form the dividing grooves 521 is halted when the saw cutter reaches the resin 15, which is formed on the main surface of the conductive substrate 511. According to the cutting operation, the areas 524 are electrically isolated to each other, and each becomes an external terminal base 17.

As shown in a region B of FIG. 21, instead of forming the dividing grooves 521, dividing holes 525, which penetrate the conductive substrate 511, may be formed between the tips of the adjacent extending parts 523a, which are extended from the adjacent slits 523. The dividing holes 525 are formed by a boring operation using a drilling machine or a laser.

As well as the other embodiments (for example, FIG. 17 of the fourth embodiment), after the external terminal bases 17 are formed, a coupling layer made of solder paste is formed on a back surface of each external terminal base 17 by the well-known solder screen printing method. This coupling layers act as external terminals. As well as the other embodiments (for example, FIG. 18 of the fourth embodiment), solder balls may be formed by using flux instead of the coupling layers.

According to the fifth embodiment, in addition to the benefits of the third embodiment, since a dimension of each external terminal base 17 is defined by the slits 523 and the extending parts 523a, which are formed very accurately prior to the step of forming the dividing grooves 521 or forming the dividing holes 525, and since the accuracy of the dimension of each external terminal bases 17 does not depend on the accuracy of the step of forming the dividing grooves 521 or of forming the dividing holes 525, the external terminal bases 17 can be formed as designed. Further, comparing to the third embodiment, since the dividing grooves 521 can be formed along the visible extending parts 523a, it is much easier to form the dividing grooves 521 than to form the dividing grooves 321 of the third embodiment. Moreover, comparing to the third embodiment, since the areas 524, which are substantially encompassed by the slits 523 and the extending parts 523a, are defined before the terminals are connected to the conductive substrate 511 by bonding wires 14, it is much easier for performing the wire bonding process.

In the fifth embodiment, every edge of the slits 523 and the extending parts 523a is formed in the right angle to the main surface of the conductive substrate 511. However, alternatively, as well as the fourth embodiment, the slits 523 and the extending parts 523a may have tapered at their side surface. In other words, each of the slits 523 and the extending parts 523a may extend from the main surface of the conductive substrate 511 toward its back surface with getting wider gradually

Sixth Embodiment

The deference between the fifth embodiment and this sixth embodiment is a step of manufacturing a conductive substrate 611. Thus, the other processes in order to form the semiconductor device are the same as or similar to those described in the fifth embodiment.

Figure 22:
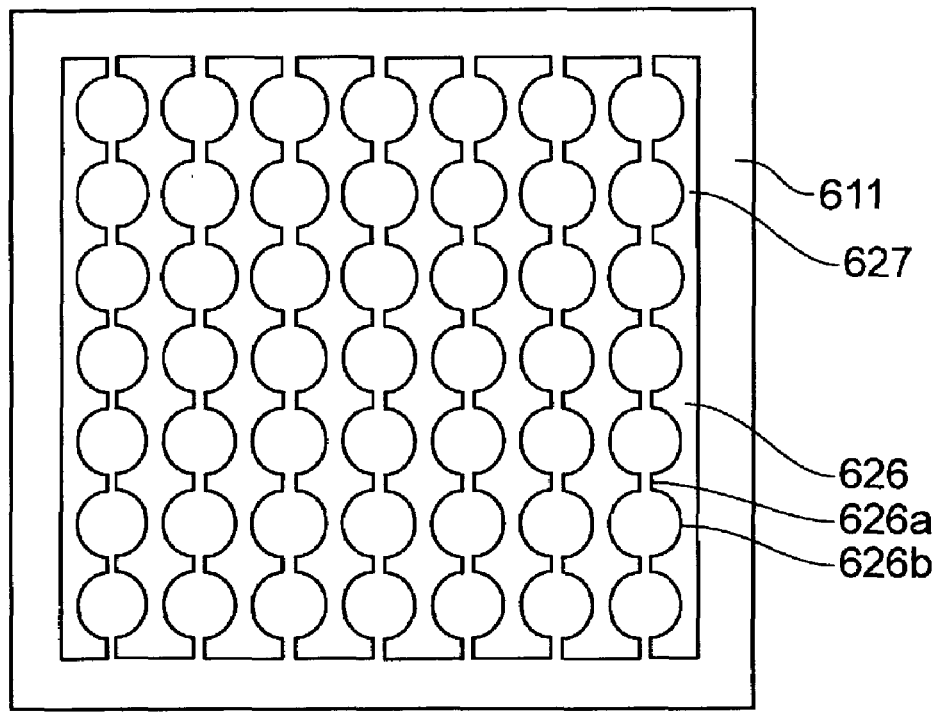
FIG. 22 is a top plane view of a conductive substrate used in a sixth embodiment of the invention.

Referring to the FIG. 22, a conductive substrate 611 having a plurality of slits 626 is prepared. The conductive substrate 611 having a thickness of 100 $\mu$m is made of the same material as used in the embodiments described above. Each slit 626 is arranged in parallel to each other, and each slit 626 elongates in the same direction along one side of the conductive substrate 611. Each slit 626 like an elongating opening penetrates the conductive substrate 611 from its main surface where a semiconductor chip 12 is disposed, to its back surface opposite to the main surface. The distance between the adjacent slits 626 is almost the same. At one edge of each slit 626 and the other edge facing to that, straight lines 626a and semicircular concavity curved lines 626b are arranged alternatively. Each length of the straight lines 626a is almost the same, and each length of the semicircular concavity curved lines 626b are almost the same. The straight lines 626a and the semicircular concavity curved lines 626b formed at one edge of the one of the slits 626 face to those formed at the other edge of its slit 626. Thus, the slit 626 having wide width is formed between the straight lines 626a, and the slit 626 having the tight width is formed between the semicircular concavity curved lines 626b. The straight lines 626a and the semicircular concavity curved lines 626b formed at one edge of the one of the slits 626 face to those formed at the other edge of an adjacent slit 626. The distance between the adjacent slits 626 is relatively short at the location where the straight lines 626a are formed, and is relatively long at the location where the semicircular concavity curved lines 626b are formed. Thus, under this state, circle areas 627, which are substantially encompassed by the slits 626, are defined.

The slits 626 having the straight lines 626a and the semicircular concavity curved lines 626b at its edges are formed by an etching operation or a photolithography. According to the etching operation or the photolithography, the slits 626 can be formed accurately as designed. Further, the slits 626 may be formed by a punching press operation, which is suitable for high accurate process.

Figure 23A:
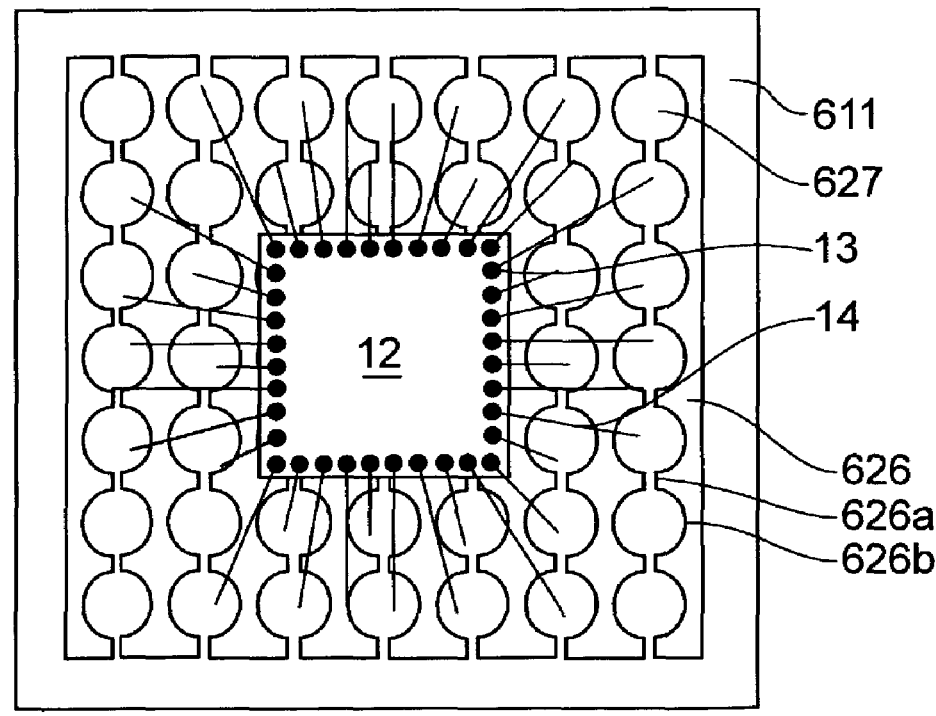
FIG. 23A is a top plane view showing a relationship among the conductive substrate shown in FIG. 22, a semiconductor chip formed on the conductive substrate and the bonding wires connecting the semiconductor chip to the conductive substrate.

Referring to FIG. 23A, the semiconductor chip 12 having terminal 13 is disposed in the center of the conductive substrate 611, and is fixed on the main surface of the conductive substrate 611 by the insulating tape. Each terminal 13 formed on the semiconductor chip 12 is connected to one of the circle areas 627 of the conductive substrate 611 by a bonding wire 14. Then, the semiconductor chip 12 and the bonding wires 14 are encapsulated on the conductive substrate 611 by resin 15. Simultaneously, the resin 15 enters into the slits 626.

Figure 23B:
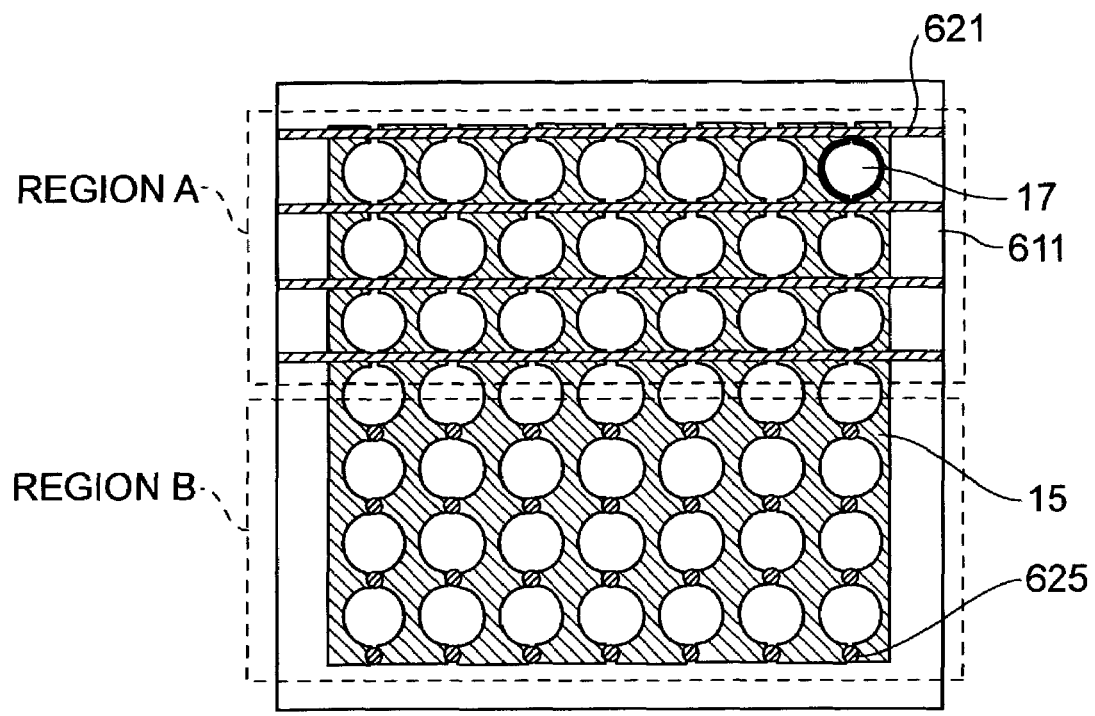
FIG. 23B is a bottom plane view showing the conductive substrate of FIG. 23A after the dividing grooves and dividing holes are formed.

Referring to FIG. 23B, after the semiconductor chip 12 and the bonding wires 14 are encapsulated by the resin 15, the resin 15 formed in the slits 626 is exposed from the back surface of the conductive substrate 611. Then, referring a region A of FIG. 23B, a plurality of dividing grooves 621, which extend perpendicular to the slits 626, are formed at the back surface of the conductive substrate 611 by a cutting operation using a saw cutter. The dividing grooves 621 cut the conductive substrate 611 at the locations, which are sandwiched by the straight lines 626a of the slits 626. Each dividing groove 621 is formed in parallel to each other. The dividing grooves 521 reach the resin 15 formed on the main surface of the conductive substrate 611. In other words, the cutting operation to form the dividing grooves 621 is halted when the saw cutter reaches the resin 15, which is formed on the main surface of the conductive substrate 611. According to the cutting operation, the circle areas 627 are electrically isolated to each other, and each becomes an external terminal base 17.

As shown in a region B of FIG. 23B, instead of forming the dividing grooves 621, dividing holes 625, which penetrate the conductive substrate 611, may be formed at the locations, which are sandwiched by the straight lines 626a of the slits 626. The dividing holes 625 are formed by a boring operation using a drilling machine or a laser.

After the external terminal bases 17 are formed, a coupling layer made of solder paste is formed on a back surface of each external terminal base 17 by the well-known solder screen printing method. The coupling layers act as external terminals. As well as the other embodiments, solder balls 18a may be formed by using flux instead of the coupling layers 18.

According to the sixth embodiment, in addition to the benefits of the fifth embodiment, since the external terminal base 17 can be formed in circular-shape, the roundish coupling layer 18 can be formed easily by utilizing the circular shape of the external terminal base 17. When the solder balls 18a are formed instead of the coupling layers 18, it is easy to control to melt the solder balls 18a by utilizing the circular shape of the external terminal base 17. As a result, it is possible to form the external terminals 17 accurately as designed.

Seventh Embodiment

The deference between the third or the fourth embodiment and this seventh embodiment is a step of manufacturing a conductive substrate 711. Thus, the other processes in order to form the semiconductor device 700 are the same as or similar to those described in the third or the fourth embodiment.

Figure 24A:
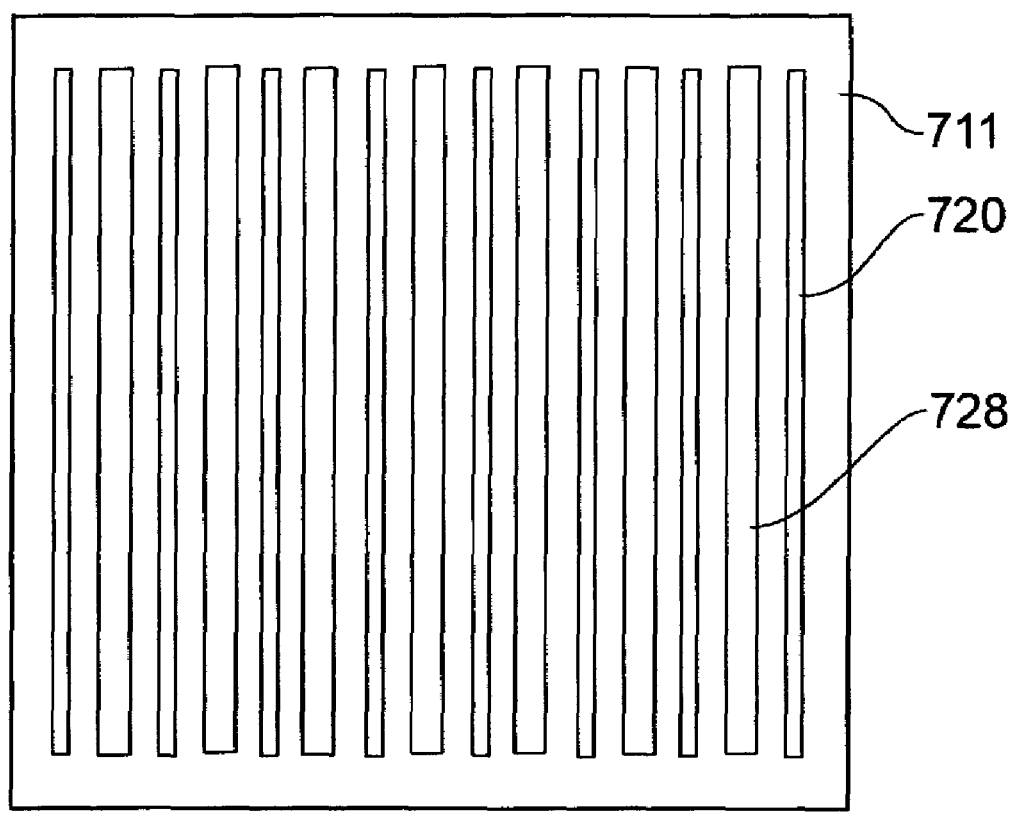
FIG. 24A is a top plane view of a conductive substrate used in a seventh embodiment of the invention.

Referring to the FIG. 24A, a conductive substrate 711 having a plurality of slits 720 and a plurality of grooves 728, which is located between the slits 720, is prepared. The conductive substrate 711 having a thickness of 100 $\mu$m is made of the same material as used in the embodiments described above. Each slit 720 is arranged in parallel to each other, and each slit 720 elongates in the same direction along one side of the conductive substrate 711. Each slit 720 like an elongating opening penetrates the conductive substrate 711 from its main surface where a semiconductor chip 12 is disposed, to its back surface opposite to the main surface.

The distance between the adjacent slits 720 is almost the same. The slits 720 are formed by the well-known cutting operation using a saw cutter, by a punching press operation or by an etching operation.

Figure 25:
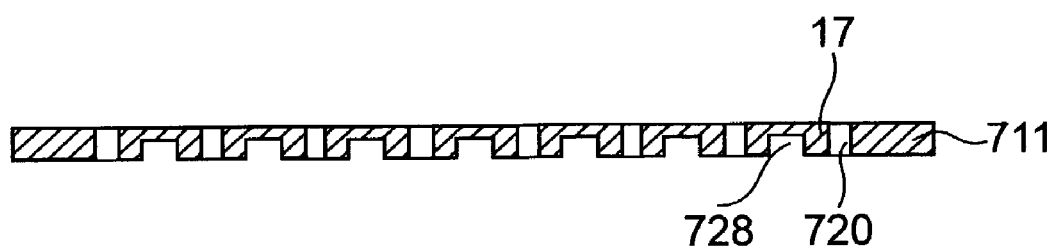
FIG. 25 is a sectional view of the conductive substrate of FIG. 24A.

Referring to FIG. 25, the grooves 728 are formed at the back surface of the conductive substrate 711, and elongate along the slits 720. The distance from one of the grooves 728 to the adjacent slits 720 is almost the same. In other words, each groove 728 is disposed in the center between the slits 720 sandwiching it. Every edge of slits 720 and the grooves 728 is formed in the right angle to the back surface of the conductive substrate 711. The depth of each groove 728 is greater than the half thickness of the conductive substrate 711, and its width is greater than that of the slits 720. The grooves 728 are formed by the well-known cutting operation using a saw cutter or by an etching operation. It is preferable to form the grooves 728 and the slits 720 simultaneously.

The semiconductor chip 12 having terminal 13 is disposed in the center of the conductive substrate 711, and is fixed on the main surface of the conductive substrate 711 by the insulating tape. Each terminal 13 formed on the semiconductor chip 12 is connected to at the predetermined location by a bonding wire 14. Then, the semiconductor chip 12 and the bonding wires 14 are encapsulated on the conductive substrate 711 by resin 15. Simultaneously, the resin 15 enters into the slits 720. However, since the grooves 728 are formed at the back surface of the conductive substrate 711, the resin 15 does not enter there, and the entire internal surface of the grooves 728 remains to be exposed.

Figure 24B:
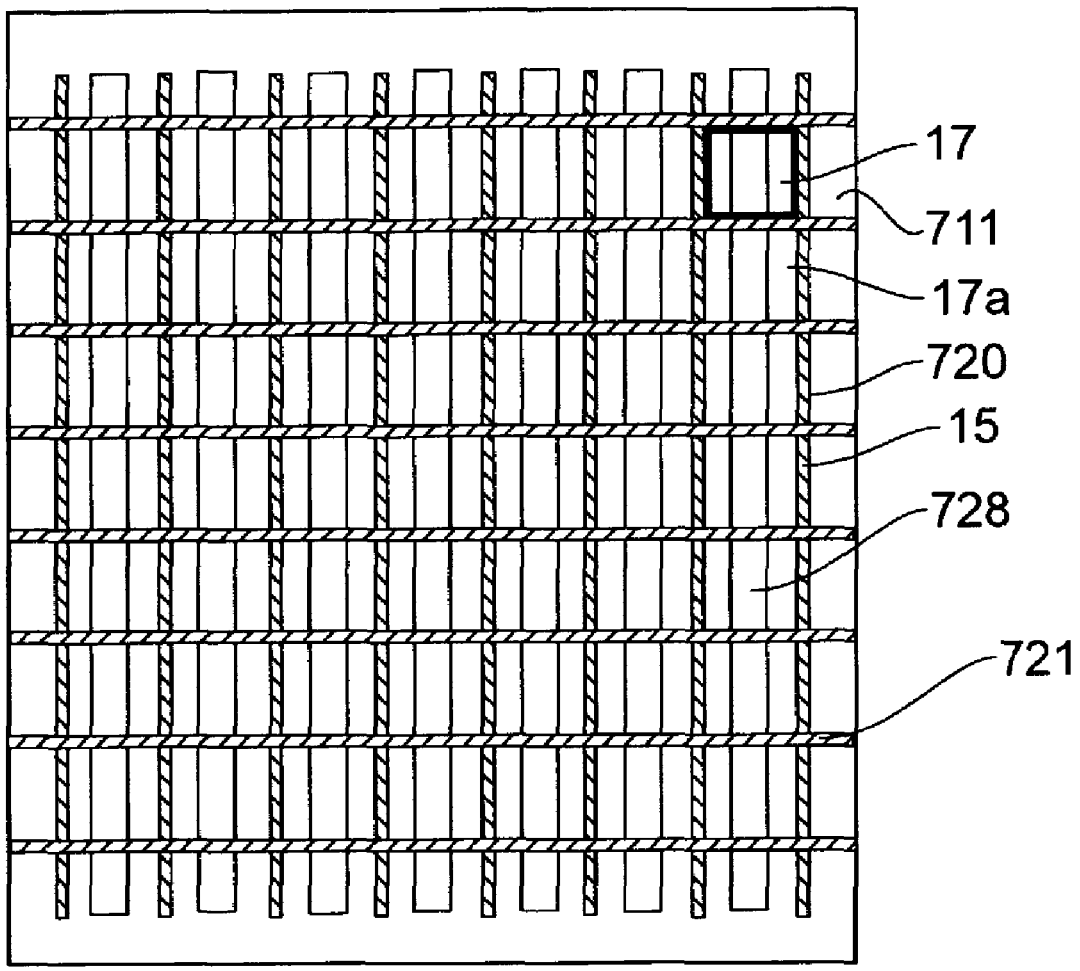
FIG. 24B is a bottom plane view showing the conductive substrate of FIG. 24A after the dividing grooves and dividing holes are formed.

Referring to FIG. 24B, after the semiconductor chip 12 and the bonding wires 14 are encapsulated by the resin 15, the resin 15 formed in the slits 720 is exposed from the back surface of the conductive substrate 711. Then, a plurality of dividing groove 721, which extend perpendicular to the slits 720 and the grooves 728, are formed by the cutting operation using a saw cutter. Each dividing groove 721 is formed in parallel to each other. The dividing grooves 721 reach the resin 15 formed on the main surface of the conductive substrate 711. In other words, the cutting operation to form the dividing grooves 721 is halted when the saw cutter reaches the resin 15, which is formed on the main surface of the conductive substrate 711. After the cutting operation is completed, the conductive substrate 711 are divided into areas 17a, which are electrically separated to each other by the dividing grooves 721 and the resin 15 formed in the slits 720, and each of areas 17a becomes an external terminal base 17.

Figure 26:
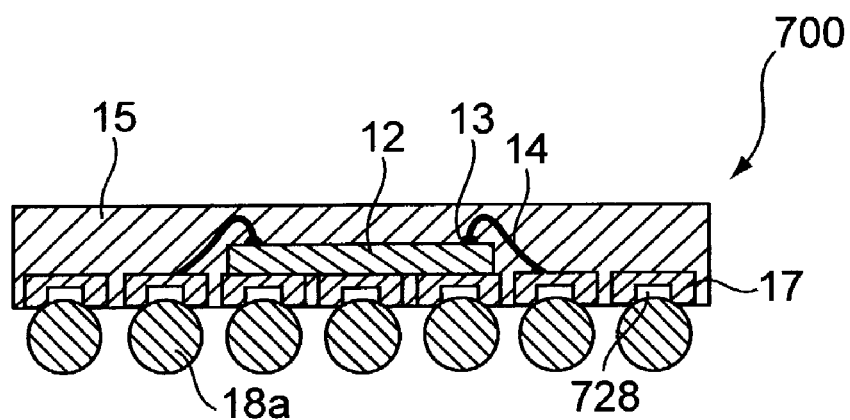
FIG. 26 is a sectional view showing an area-array package type semiconductor device of the seventh embodiment.

Referring to FIG. 26, after the external terminal bases 17 are formed, solder balls 18a, each of which acts as an external terminal, are formed by using flux on the external terminal bases 17 having the exposed grooves 728. Then, the semiconductor device 700 is completed.

Accordion to the seventh embodiment, in addition to the benefits of the third embodiment, since the solder balls 18a are formed on the external terminal bases 17 having the exposed grooves 728, the groove 728 at one of the external terminal base 17 holds a part of the solder ball 18a formed therein. Thus, it is easy to place the solder ball accurately as designed. Further, since the solder balls 18a are formed on the external terminal bases 17 having the exposed grooves 728, an area contacting the solder ball 18a to the external terminal base 17 increases. Thus, a coupling strength between the solder ball 18a and the external terminal base 17 increases.

Alternatively, each groove 728 may have a reversed V-shape on its cross sectional shape. Namely, the reversed V-shape groove 728 extends from the back surface of the conductive substrate 711 toward the main surface with getting narrower. According to this alternative, the area contacting the solder ball 18a to the external terminal base 17 further increases.

Eighth Embodiment

The deference between the seventh embodiment and this eighth embodiment is a step of manufacturing a conductive substrate 811. Thus, the other processes in order to form the semiconductor device 800 are the same as or similar to those described in the seventh embodiment.

Figure 27A:
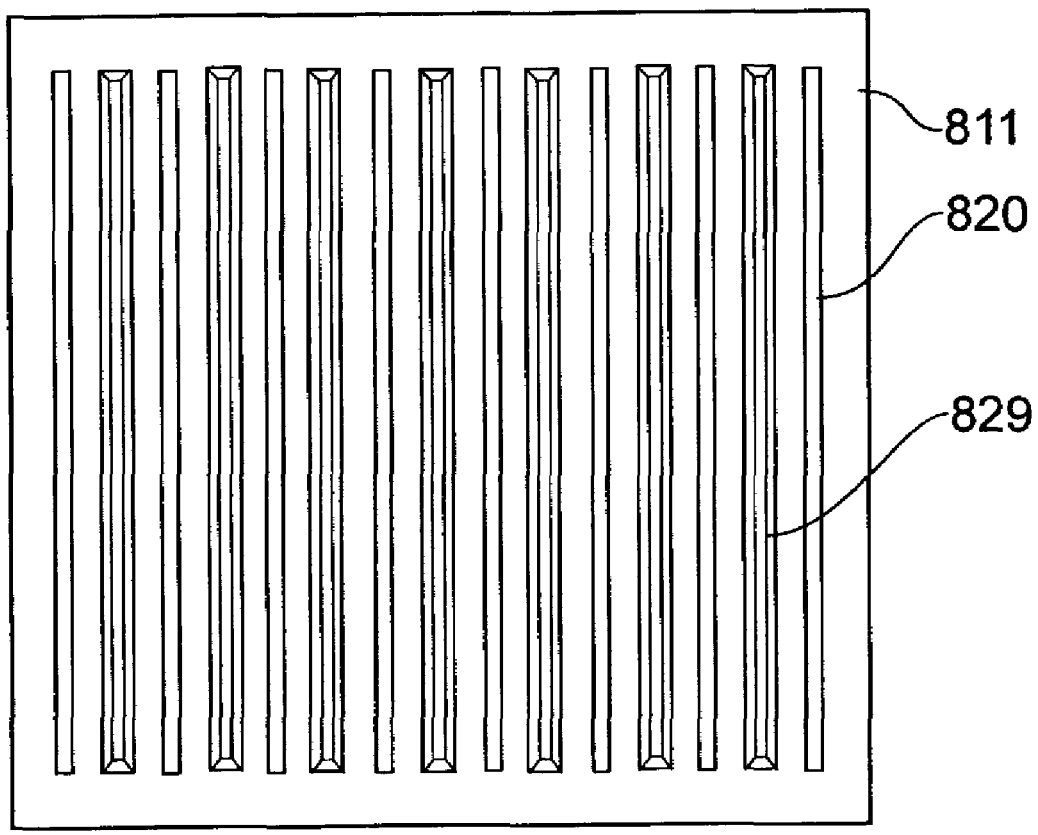
FIG. 27A is a top plane view of a conductive substrate used in a eighth embodiment of the invention.
Figure 28:
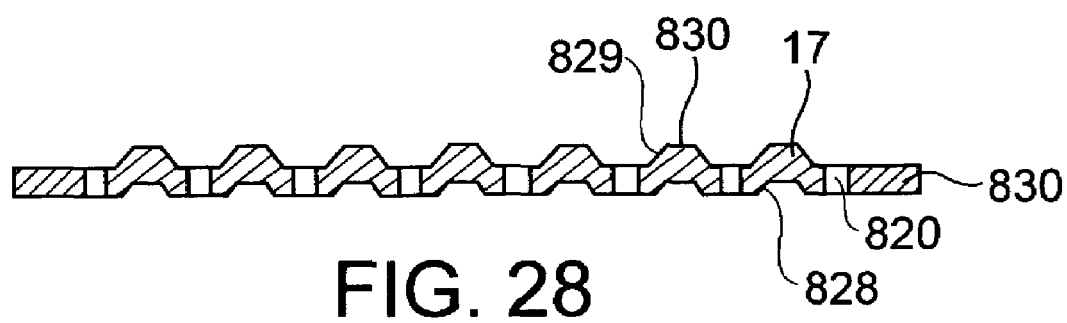
FIG. 28 is a sectional view of the conductive substrate of FIG. 27A.

Referring to the FIG. 27A, a conductive substrate 811 having a plurality of slits 820, a plurality of grooves 828 and a plurality of transformed projection parts 829, which are located between the slits 820, is prepared. The conductive substrate 811 having a thickness of 100 $\mu$m is made of the same material as used in the embodiments described above. Each slit 820 is arranged in parallel to each other, and each slit 820 elongates in the same direction along one side of the conductive substrate 811. Each slit 820 like an elongating opening penetrates the conductive substrate 811 from its main surface on which a semiconductor chip 12 is disposed, to its back surface opposite to the main surface. The distance between the adjacent slits 820 is almost the same. The slits 820 are formed by the well-known cutting operation using a saw cutter, by a punching press operation or by an etching operation Referring to FIG. 28, the grooves 828 are formed at the back surface of the conductive substrate 811, and elongates along the slits 820. The distance from one of the grooves 828 to the adjacent slits 820 is almost the same. In other words, each groove 828 is disposed in the center between the slit sandwiching it. While every edge of slits 820 is formed in the right angle to the main surface of the conductive substrate 811, the each groove tapered toward the main surface of the conductive substrate 811. In other wards, each groove 828 extends from the back surface of the conductive substrate 811 toward the main surface with getting narrower. Thus, the cross sectional shape of each groove 828 is a trapezoid. The depth of the grooves 828 is greater than the half thickness of the conductive substrate 811, and its width at the back surface of conductive substrate 811 is greater than that of the slits 820. The grooves 828 are formed by a punching press operation.

As described above, the conductive substrate 811 includes a plurality of transformed projection parts 829, which are located between the slits 820. The transformed projection parts 829 elongate along the slits 820. The cross-sectional surface of each transformed projection part 829 is trapezoid-shaped. Thus, a plane surface 830 is formed at the top of each transformed projection part 829. The transformed projection parts 829 are formed at the same time that the grooves 828 are formed. Namely, when the punching press operation is performed to the conductive substrate 811 in order to form the grooves 828, the transformed projection parts 829 are formed simultaneously. That is, the conductive substrate 811 itself is transformed to create the transformed projection parts 829 and the grooves 828.

The semiconductor chip 12 having terminal 13 is disposed in the center of the conductive substrate 811, and is fixed on the plane surfaces 830 of the transformed projection parts 829 of the conductive substrate 811 by the insulating tape. Each terminal 13 formed on the semiconductor chip 12 is connected to the plane surface 830 at the predetermined location by a bonding wire 14. Then, the semiconductor chip 12 and the bonding wires 14 are encapsulated on the conductive substrate 811 by resin 15. Simultaneously, the resin 15 enters into the slits 820. However, since the grooves 828 are formed at the back surface of the conductive substrate 811, the resin 15 does not enter there, and the entire internal surface of the grooves 828 remains to be exposed. Since the main surface of the conductive substrate 811 is not even because of the transformed projection parts 829, a contacting area of the resin 15 with the conductive substrate 811 increases.

Figure 27B:
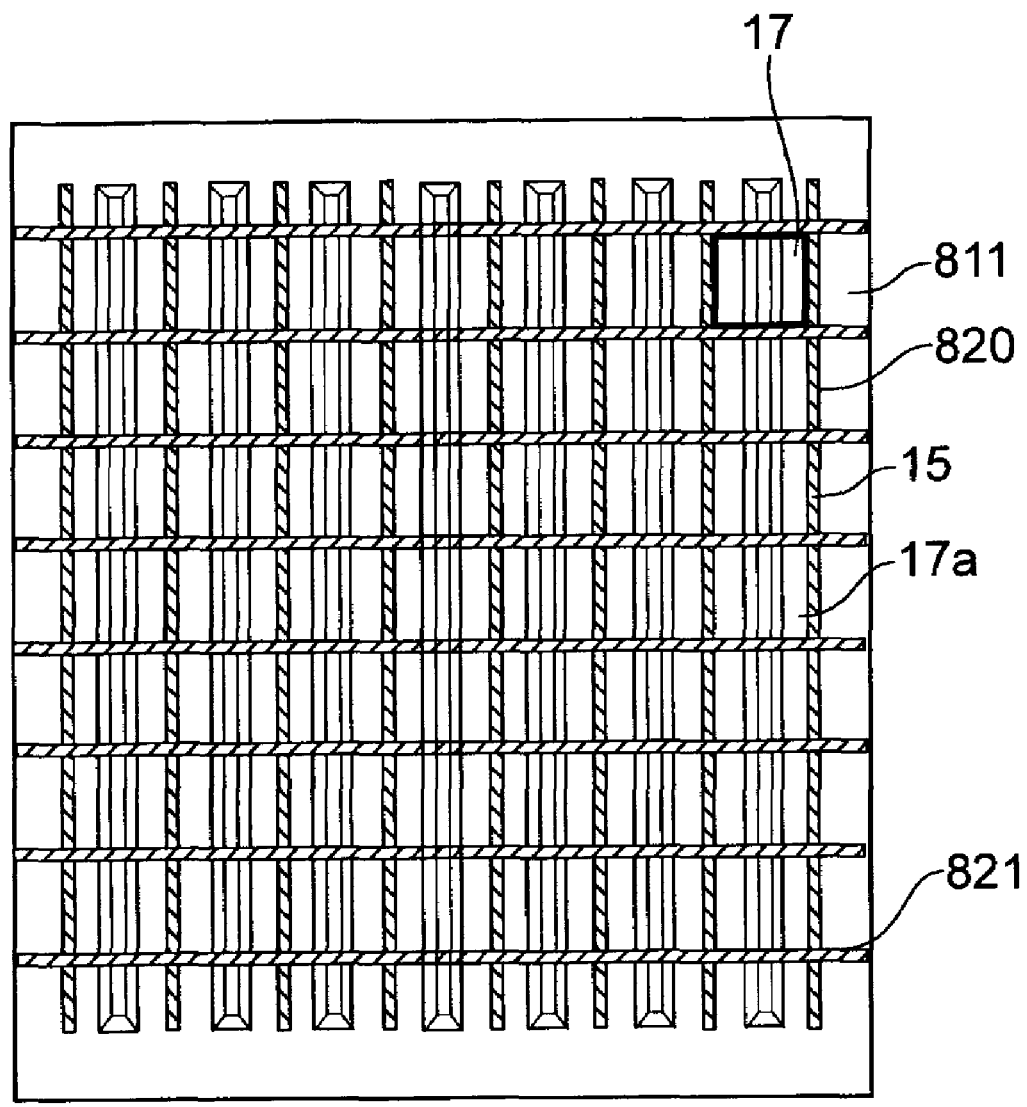
FIG. 27B is a bottom plane view showing the conductive substrate of FIG. 27A after the dividing grooves and dividing holes are formed.

Referring to FIG. 27B, after the semiconductor chip 12 and the bonding wires 14 are encapsulated by the resin 15, the resin 15 formed in the slits 820 is exposed from the back surface of the conductive substrate 811. Then, a plurality of dividing groove 821, which extend perpendicular to the slits 820 and the grooves 828, are formed by the cutting operation using a saw cutter. Each dividing groove 821 is formed in parallel to each other. The dividing grooves 821 reach the resin 15 formed on the plane surface 830. In other words, the cutting operation to form the dividing grooves 821 is halted when the saw cutter reaches the resin 15, which is formed on areas of the conductive substrate 811 at which the transformed projection parts 829 are not formed. After the cutting operation is completed, the conductive substrate 811 are divided into areas 17a, which are electrically separated to each other by the dividing groove 821 and the resin 15 formed in the slits 820, and each of areas 17a becomes an external terminal base 17.

Figure 29:
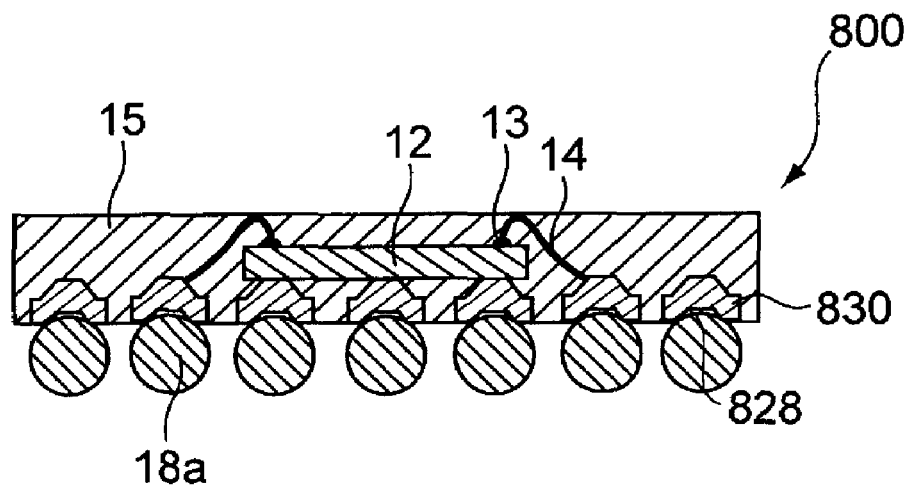
FIG. 29 is a sectional view showing an area-array package type semiconductor device of the eighth embodiment.

Referring to FIG. 29, after the external terminal bases 17 are formed, solder balls 18a, each of which acts as an external terminal, are formed by using flux on the external terminal bases 17 having the exposed grooves 821. Then, the semiconductor device 800 is completed.

Accordion to the eighth embodiment, in addition to the benefits of the seventh embodiment, since the transformed projection parts 829 are formed on the main surface of the conductive substrate 811, the contacting area of the resin 15 with the conductive substrate 811 increases depending on the amount of the projection of the transformed projection parts 829. Thus, the resin 15 is firmly coupled with the conductive substrate 811.

Moreover, since the semiconductor device 12 is placed on the transformed projection parts 829, the semiconductor device 12 is positioned higher than the level of the main surface of the conductive substrate 811 between the transformed projection parts 829. Thus, when the saw cutter over-cuts the conductive substrate 811 to form the dividing grooves 821 by accident, the semiconductor device 12 will not be damaged by the saw cutter.

Ninth Embodiment

The deference between the eighth embodiment and this ninth embodiment is a step of manufacturing a conductive substrate 911. Thus, the other processes in order to form the semiconductor device 900 are the same as or similar to those described in the eighth embodiment.

Figure 30A:
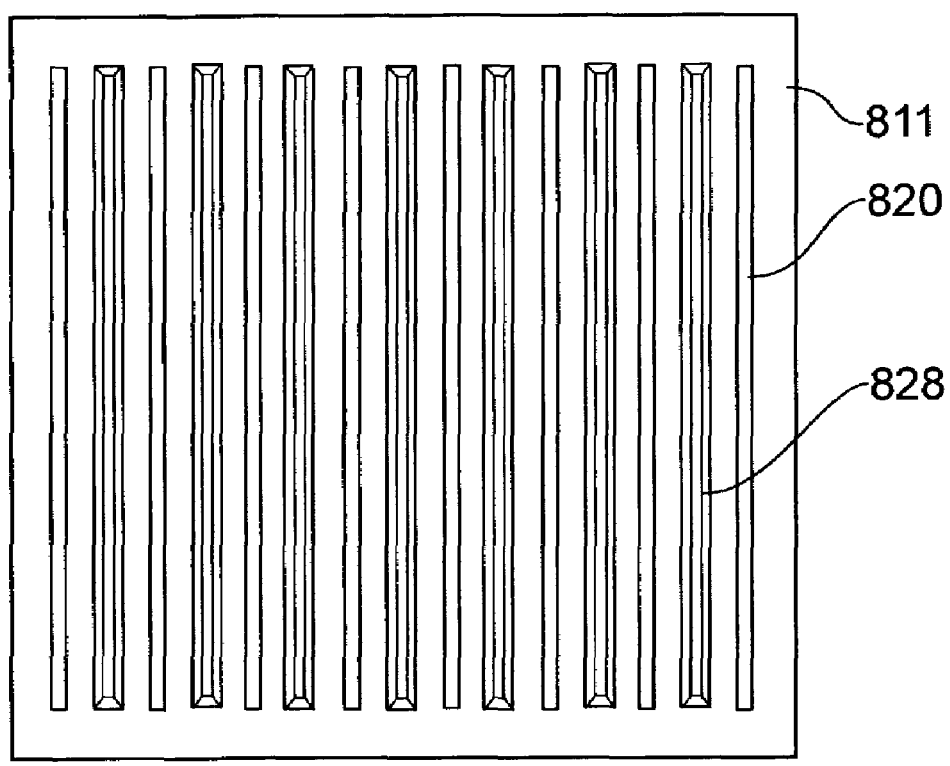
FIG. 30A is a top plane view of a conductive substrate used in a ninth embodiment of the invention.
Figure 31:
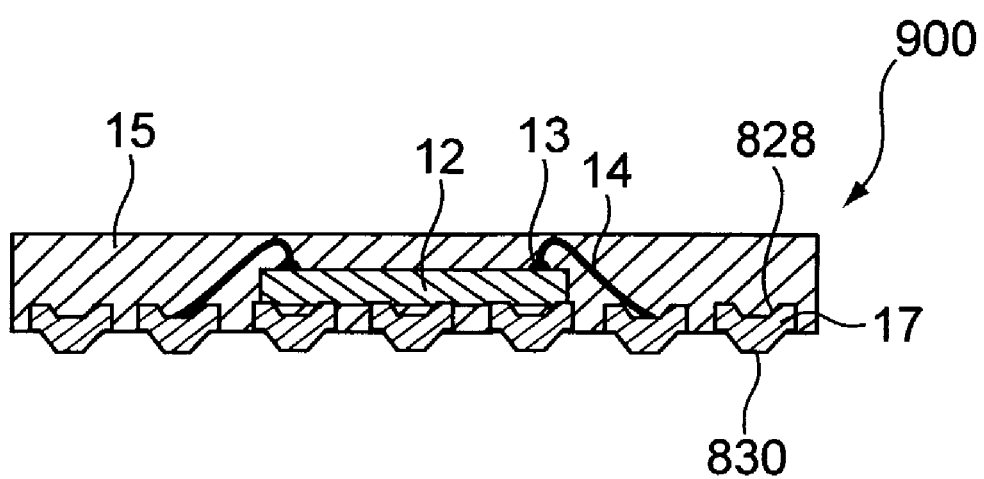
FIG. 31 is a sectional view showing an area-array package type semiconductor device of the ninth embodiment.

Referring to the FIG. 30A, a conductive substrate 811 having a plurality of slits 820, a plurality of grooves 828 and a plurality of transformed projection parts 829, which are located between the slits 820, is prepared. The structure of the conductive substrate 811 of the eighth embodiment equals that of the conductive substrate 811 of the ninth embodiment. Thus, the method of forming the conductive substrate 811 of the ninth embodiment also equals that of forming the conductive substrate 811 of the eighth embodiment. However, a method of using the conductive substrate 811 of the ninth embodiment is different from that of the eighth embodiment. That is, as shown in FIG. 31, a semiconductor chip 12 having terminal 13 is disposed in the center of the conductive substrate 811, and is fixed on the back surfaces of the transformed projection parts 829 of the conductive substrate 811 on which the grooves 828 are formed, by the insulating tape. Each terminal 13 formed on the semiconductor chip 12 is connected to the back surface 830 at the predetermined location in the grooves 828 by a bonding wire 14. Then, the semiconductor chip 12 and the bonding wires 14 are encapsulated on the back surface of the conductive substrate 811 by resin 15. Simultaneously, the resin 15 enters into the slits 820 and the grooves 828. However, since the transformed projection parts 830 are formed on the main surface of the conductive substrate 811, the transformed projection parts 830 remains to be exposed. Since the grooves 828 are formed at the back surface of the conductive substrate 811, a contacting area of the resin 15 with the conductive substrate 811 increases.

Figure 30B:
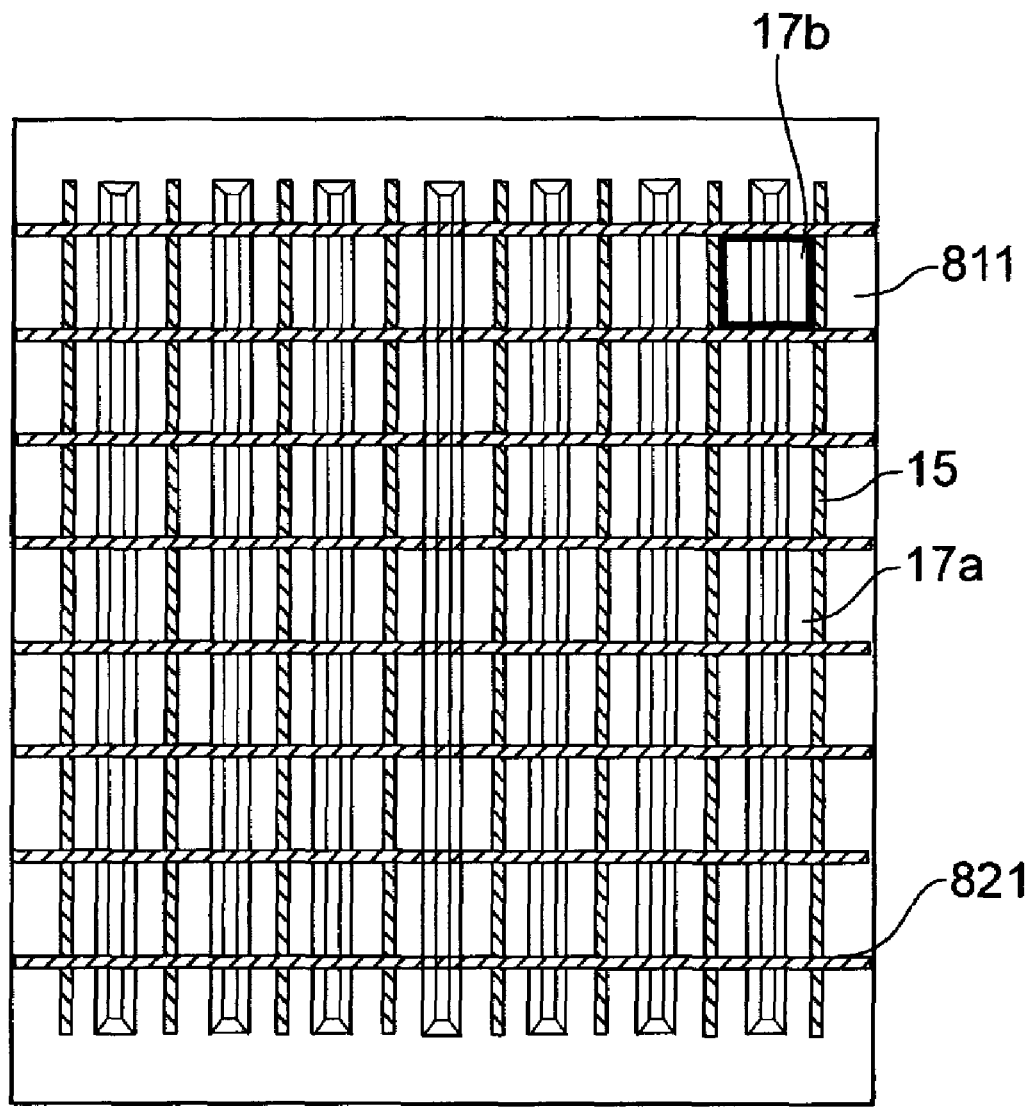
FIG. 30B is a bottom plane view showing the conductive substrate of FIG. 30A after the dividing grooves and dividing holes are formed.

Referring to FIG. 30B, after the semiconductor chip 12 and the bonding wires 14 are encapsulated by the resin 15, the resin 15 formed in the slits 820 is exposed from the main surface of the conductive substrate 811. Then, a plurality of dividing groove 821, which extend perpendicular to the slits 820 and the transformed projection parts 829, are formed by the cutting operation using a saw cutter. Each dividing groove 821 is formed in parallel to each other. The dividing grooves 821 reach the back surface of the conductive substrate 811 at which the grooves 828 are not formed. In other words, the cutting operation to form the dividing grooves 821 is halted when the saw cutter reaches the resin 15, which is formed on areas of the conductive substrate 811 at which the grooves 828 are not formed. After the cutting operation is completed, the conductive substrate 811 are divided into areas 17a, which are electrically separated to each other by the dividing groove 821 and the resin 15 formed in the slits 820, and each of areas 17a becomes an external terminal 17b. Comparing to the other embodiments, the transformed projection parts 830 are formed on the exposed surface of the conductive substrate 811, the transformed projection parts 830 can be used for the external terminal. Thus, no coupling layers or solder balls is needed.

According to the ninth embodiment, in addition to the benefits of the eighth embodiment, the transformed projection parts 830 themselves can be used for the external terminal, it is not necessary to form any coupling layers or solder balls on the conductive substrate 811. As a result, it is possible to reduce the possibility of the loose connection, which may occurs at the process of forming the coupling layers or the solder balls.

While the invention has been described with reference to illustrative embodiments, this description is not intended to be construed in a limiting sense. For example, dummy coupling layers or dummy solder balls can be formed on the external terminal bases, which are not electrically connected to the semiconductor chip in the second through the eighth embodiments. Further, as well as described in the fifth embodiment with reference to the region B of FIG. 21, dividing holes can be formed instead of the dividing grooves in the seventh through the ninth embodiments. Various other modifications of the illustrated embodiments, as well as other embodiments of the invention, will be apparent to those skilled in the art on reference to this description. Therefore, the appended claims are intended cover any such modifications or embodiments as fall within the true scope of the invention.

What I claim is:

1. A method of manufacturing a semiconductor device, comprising the steps of:
   preparing a conductive substrate having a main surface and a back surface opposite to the main surface;
   forming a plurality of slits in the conductive substrate, which are parallel to each other, and which penetrate the conductive substrate;
   fixing a semiconductor chip to the main surface of the conductive substrate;
   encapsulating the semiconductor chip with resin by introducing the resin onto the main surface of the conductive substrate, the resin entering into the slits; and
   dividing the conductive substrate extending between the slits from the back surface,
   wherein each slit has a trapezoid shape at its cross sectional surface, and its width at the main surface of the conductive substrate is shorter than that at the back surface of the conductive substrate.

2. A method of manufacturing a semiconductor device as claim in claim 1, further comprising a step of forming external terminals on the back surface of the conductive substrate after the conductive substrate is divided.

3. A method of manufacturing a semiconductor device as claim in claim 1 wherein the step of dividing the conductive substrate being existed between the slits from the back surface includes a step of forming dividing grooves at the back surface of the conductive substrate, which are perpendicular to the slits, the dividing grooves reaching the resin formed on the main surface of the conductive substrate.

4. A method of manufacturing a semiconductor device as claim in claim 1 wherein the step of dividing the conductive substrate being existed between the slits from the back surface includes a step of forming dividing holes between the slits, the dividing holes reaching the resin formed on the main surface of the conductive substrate.

5. A method of manufacturing a semiconductor device as claim in claim 1 wherein an edge of each slit is perpendicular to the main surface of the conductive substrate.

6. A method of manufacturing a semiconductor device as claim in claim 1 wherein the slits are formed by etching.

7. A method of manufacturing a semiconductor device as claim in claim 1 wherein the slits are formed by a punching press operation.

8. A method of manufacturing a semiconductor device as claim in claim 1 further comprising a step of forming a plurality of extending parts in the conductive substrate, each extending part, which penetrates the conductive substrate, extending from one of the slits to a direction perpendicular to the direction in which the slits extend, and the extending parts being formed at regular intervals, the extending parts, which are extending from the adjacent slits, facing to each other and sandwiching a part of the conductive substrate.

9. A method of manufacturing a semiconductor device as claim in claim 8 wherein the slits and the extending parts are formed simultaneously.

10. A method of manufacturing a semiconductor device as claim in claim 8 wherein the step of dividing the conductive substrate being existed between the slits from the back surface includes a step of forming dividing grooves at the back surface of the conductive substrate, which are parallel to the extending parts, the dividing grooves reaching the resin formed on the main surface of the conductive substrate.

11. A method of manufacturing a semiconductor device as claim in claim 8 wherein the step of dividing the conductive substrate being existed between the slits from the back surface includes a step of forming dividing holes at the part of the conductive substrate between the extending parts, the dividing holes reaching the resin formed on the main surface of the conductive substrate.

12. A method of manufacturing a semiconductor device as claim in claim 8 wherein edges of each slit and each extending part are perpendicular to the main surface of the conductive substrate respectively.

13. A method of manufacturing a semiconductor device as claim in claim 8 wherein each slit and each extending part have trapezoid shapes at their cross sectional surfaces, respectively, and their widths at the main surface of the conductive substrate are shorter than those at the back surface of the conductive substrate.

14. A method of manufacturing a semiconductor device as claim in claim 8 wherein the slits and the extending parts are formed by etching.

15. A method of manufacturing a semiconductor device as claim in claim 8 wherein the slits and the extending parts are formed by a punching press operation.

16. A method of manufacturing a semiconductor device as claim in claim 1 further comprising a step of forming a plurality of grooves between the slits at the back surface of the conductive substrate before fixing the semiconductor chip to the main surface of the conductive substrate, each grooves extend in parallel to the slits.

17. A method of manufacturing a semiconductor device as claim in claim 16 further comprising a step of forming external terminals in the grooves.

18. A method of manufacturing a semiconductor device as claim in claim 16 wherein the step of dividing the conductive substrate being existed between the slits from the back surface includes a step of forming dividing grooves at the back surface of the conductive substrate, which are perpendicular to the slits, the dividing grooves reaching the resin formed on the main surface of the conductive substrate.

19. A method of manufacturing a semiconductor device as claim in claim 16 wherein the step of dividing the conductive substrate being existed between the slits from the back surface includes a step of forming dividing holes between the slits, the dividing holes reaching the resin formed on the main surface of the conductive substrate.

20. A method of manufacturing a semiconductor device as claim in claim 16 wherein the width of each slit is shorter than that of each groove.

21. A method of manufacturing a semiconductor device as claim in claim 16 further comprising a step of transforming parts of the conductive substrate, each of which corresponds to the grooves, each transformed part, which is projected from the main surface, extending in parallel to the slits.

22. A method of manufacturing a semiconductor device as claim in claim 21 wherein the step of dividing the conductive substrate being existed between the slits from the back surface includes a step of forming dividing grooves at the back surface of the conductive substrate, which are perpendicular to the slits, the dividing grooves reaching the resin formed on the transformed parts of the conductive substrate.

23. A method of manufacturing a semiconductor device as claim in claim 21 wherein the step of dividing the conductive substrate being existed between the slits from the back surface includes a step of forming dividing holes between the slits, the dividing holes reaching the resin formed on the transformed parts of the conductive substrate.

24. A method of manufacturing a semiconductor device as claim in claim 21 further comprising a step of forming external terminals in the grooves.

25. A method of manufacturing a semiconductor device as claim in claim 1 further comprising a step of forming a plurality of grooves between the slits at the main surface of the conductive substrate before fixing the semiconductor chip to the main surface of the conductive substrate, each grooves extend in parallel to the slits.

26. A method of manufacturing a semiconductor device as claim in claim 25 further comprising a step of transforming parts of the conductive substrate, each of which corresponds to the grooves, each transformed part, which is projected from the back surface, extending in parallel to the slits.

27. A method of manufacturing a semiconductor device as claim in claim 26 wherein the transformed parts and the grooves are formed simultaneously.

28. A method of manufacturing a semiconductor device as claim in claim 26 wherein the transformed parts and the grooves are formed by a press operation.

29. A method of manufacturing a semiconductor device as claim in claim 25 wherein the step of dividing the conductive substrate being existed between the slits from the back surface includes a step of forming dividing grooves at the back surface of the conductive substrate, which are perpendicular to the slits, the dividing grooves reaching the resin formed on the main surface of the conductive substrate.

30. A method of manufacturing a semiconductor device as claim in claim 25 wherein the step of dividing the conductive substrate being existed between the slits from the back surface includes a step of forming dividing holes between the slits, the dividing holes reaching the resin formed on the main surface of the conductive substrate.

31. A method of manufacturing a semiconductor device as claim in claim 25 wherein the width of each slit is shorter than that of each groove.

32. A method of manufacturing a semiconductor device, comprising the steps of:
preparing a conductive substrate having a main surface and a back surface opposite to the main surface;
forming a plurality of slits in the conductive substrate, which are parallel to each other, and which penetrate the conductive substrate;
fixing a semiconductor chip to the main surface of the conductive substrate;
encapsulating the semiconductor chip with resin by introducing the resin onto the main surface of the conductive substrate, the resin entering into the slits; and
dividing the conductive substrate extending between the slits from the back surface,
wherein the step of forming the slits includes a step of forming a plurality of slits each of which has straight lines and semicircular concavity curved lines at its both sides alternatively, the straight lines and the semicircular concavity curved of the adjacent slits being faced to each other.

33. A method of manufacturing a semiconductor device as claim in claim 32 wherein the step of dividing the conductive substrate being existed between the slits from the back surface includes a step of forming dividing grooves at the back surface of the conductive substrate, which are perpendicular to the slits, in order to cut the conductive substrate existing between the straight lines of the slits, the dividing grooves reaching the resin formed on the main surface of the conductive substrate.

34. A method of manufacturing a semiconductor device as claim in claim 32 wherein the step of dividing the conductive substrate being existed between the slits from the back surface includes a step of forming dividing holes at the conductive substrate existing between the straight lines of the slits, the dividing holes reaching the resin formed on the main surface of the conductive substrate.

35. A method of manufacturing a semiconductor device as claim in claim 32 wherein an edge of each slit is perpendicular to the main surface of the conductive substrate.

36. A method of manufacturing a semiconductor device as claim in claim 32 wherein each slit has a trapezoid shape at its cross sectional surface, and its width at the main surface of the conductive substrate is shorter than that at the back surface of the conductive substrate.

37. A method of manufacturing a semiconductor device as claim in claim 32 wherein the slits are formed by etching.

38. A method of manufacturing a semiconductor device as claim in claim 32 wherein the slits are formed by a punching press operation.

39. A method of manufacturing a semiconductor device, comprising the steps of:
preparing a conductive substrate having a main surface and a back surface opposite to the main surface;
forming a plurality of slits in the conductive substrate, which are parallel to each other, and which penetrate the conductive substrate;
fixing a semiconductor chip to the main surface of the conductive substrate;
encapsulating the semiconductor chip with resin by introducing the resin onto the main surface of the conductive substrate, the resin entering into the slits;
dividing the conductive substrate extending between the slits from the back surface;
forming a plurality of grooves between the slits at the back surface of the conductive substrate before fixing the semiconductor chip to the main surface of the conductive substrate, each grooves extend in parallel to the slits; and
transforming parts of the conductive substrate, each of which corresponds to the grooves, each transformed part, which is projected from the main surface, extending in parallel to the slits,
wherein each transformed part has a trapezoid shape at its cross sectional surface, and each groove has a trapezoid shape at its cross sectional surface.

40. A method of manufacturing a semiconductor device as claim in claim 39 wherein the transformed parts and the grooves are formed simultaneously.

41. A method of manufacturing a semiconductor device as claim in claim 40 wherein the transformed parts and the grooves are formed by a press operation.

42. A method of manufacturing a semiconductor device, comprising the steps of:
preparing a conductive substrate having a main surface and a back surface opposite to the main surface;
forming a plurality of slits in the conductive substrate, which are parallel to each other, and which penetrate the conductive substrate;
forming a plurality of grooves between the slits at the main surface of the conductive substrate before fixing the semiconductor chip to the main surface of the conductive substrate, each grooves extend in parallel to the slits;
fixing a semiconductor chip to the main surface of the conductive substrate;

encapsulating the semiconductor chip with resin by introducing the resin onto the main surface of the conductive substrate, the resin entering into the slits;

dividing the conductive substrate extending between the slits from the back surface;

transforming parts of the conductive substrate, each of which corresponds to the grooves, each transformed part, which is projected from the back surface, extending in parallel to the slits wherein each transformed part has a reversed trapezoid shape at its cross sectional surface, and each groove has a reversed trapezoid shape at its cross sectional surface.

* * * * *